(12) United States Patent
Tang

(10) Patent No.: US 9,129,983 B2
(45) Date of Patent: Sep. 8, 2015

(54) MEMORY CELLS, MEMORY ARRAYS, METHODS OF FORMING MEMORY CELLS, AND METHODS OF FORMING A SHARED DOPED SEMICONDUCTOR REGION OF A VERTICALLY ORIENTED THYRISTOR AND A VERTICALLY ORIENTED ACCESS TRANSISTOR

(71) Applicant: Micron Technology, Inc., Boise, ID (US)

(72) Inventor: Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/066,811

(22) Filed: Oct. 30, 2013

(65) Prior Publication Data

US 2014/0057398 A1 Feb. 27, 2014

Related U.S. Application Data

(62) Division of application No. 13/025,591, filed on Feb. 11, 2011, now Pat. No. 8,598,621.

(51) Int. Cl.
| | |
|---|---|
| *H01L 21/332* | (2006.01) |
| *H01L 29/66* | (2006.01) |
| *H01L 27/102* | (2006.01) |
| *H01L 27/105* | (2006.01) |
| *H01L 27/11* | (2006.01) |
| *H01L 29/74* | (2006.01) |
| *H01L 29/94* | (2006.01) |
| *H01L 21/8229* | (2006.01) |

(52) U.S. Cl.
CPC ...... *H01L 29/66386* (2013.01); *H01L 21/8229* (2013.01); *H01L 27/105* (2013.01); *H01L 27/1027* (2013.01); *H01L 27/11* (2013.01); *H01L 29/74* (2013.01); *H01L 29/94* (2013.01)

(58) Field of Classification Search
CPC .. H01L 21/8229; H01L 27/11; H01L 27/1027
USPC .................. 438/133, 134, 138; 257/E21.391, 257/E21.388
See application file for complete search history.

(56) References Cited

U.S. PATENT DOCUMENTS

| | | |
|---|---|---|
| 3,988,771 A | 10/1976 | Krishna |
| 4,487,639 A | 12/1984 | Lam et al. |

(Continued)

FOREIGN PATENT DOCUMENTS

| | | |
|---|---|---|
| CN | 101621036 | 6/2010 |
| CN | 201180011628.6 | 6/2014 |

(Continued)

OTHER PUBLICATIONS

U.S. Appl. No. 12/410,207, filed Mar. 24, 2009, Tang et al.

(Continued)

*Primary Examiner* — Minchul Yang
(74) *Attorney, Agent, or Firm* — Wells St. John, P.S.

(57) ABSTRACT

A memory cell includes a thyristor having a plurality of alternately doped, vertically superposed semiconductor regions; a vertically oriented access transistor having an access gate; and a control gate operatively laterally adjacent one of the alternately doped, vertically superposed semiconductor regions. The control gate is spaced laterally of the access gate. Other embodiments are disclosed, including methods of forming memory cells and methods of forming a shared doped semiconductor region of a vertically oriented thyristor and a vertically oriented access transistor.

22 Claims, 19 Drawing Sheets

(56) References Cited

U.S. PATENT DOCUMENTS

| | | |
|---|---|---|
| 5,098,861 A | 3/1992 | Blackstone |
| 5,102,821 A | 4/1992 | Moslehi |
| 5,106,776 A | 4/1992 | Shen et al. |
| 5,260,233 A | 11/1993 | Buti et al. |
| 5,373,184 A | 12/1994 | Moslehi |
| 5,412,598 A | 5/1995 | Shulman |
| 5,465,249 A | 11/1995 | Cooper, Jr. et al. |
| 5,471,039 A | 11/1995 | Irwin, Jr. et al. |
| 5,510,630 A | 4/1996 | Agarwal et al. |
| 5,563,084 A | 10/1996 | Ramm et al. |
| 5,600,160 A | 2/1997 | Hvistendahl |
| 5,874,760 A | 2/1999 | Burns, Jr. et al. |
| 5,904,507 A | 5/1999 | Thomas |
| 5,909,618 A | 6/1999 | Forbes et al. |
| 5,920,105 A | 7/1999 | Okamoto et al. |
| 5,930,640 A | 7/1999 | Kenney |
| 5,936,274 A | 8/1999 | Forbes et al. |
| 5,963,469 A | 10/1999 | Forbes |
| 6,017,778 A | 1/2000 | Pezzani |
| 6,033,957 A | 3/2000 | Burns, Jr. et al. |
| 6,137,128 A | 10/2000 | Holmes et al. |
| 6,191,476 B1 | 2/2001 | Takahashi et al. |
| 6,225,151 B1 | 5/2001 | Gardner et al. |
| 6,225,165 B1 | 5/2001 | Noble, Jr. et al. |
| 6,229,161 B1 | 5/2001 | Nemati et al. |
| 6,245,663 B1 | 6/2001 | Zhao et al. |
| 6,255,731 B1 | 7/2001 | Ohmi et al. |
| 6,274,888 B1 | 8/2001 | Suzuki et al. |
| 6,294,418 B1 | 9/2001 | Noble |
| 6,303,468 B1 | 10/2001 | Aspar et al. |
| 6,335,231 B1 | 1/2002 | Yamazaki et al. |
| 6,335,258 B1 | 1/2002 | Aspar et al. |
| 6,352,894 B1 | 3/2002 | Goebel et al. |
| 6,355,501 B1 | 3/2002 | Fung et al. |
| 6,355,520 B1 | 3/2002 | Park et al. |
| 6,365,488 B1 | 4/2002 | Liao |
| 6,391,658 B1 | 5/2002 | Gates et al. |
| 6,492,662 B2 | 12/2002 | Hsu et al. |
| 6,559,471 B2 | 5/2003 | Finder et al. |
| 6,576,944 B2 | 6/2003 | Weis |
| 6,593,624 B2 | 7/2003 | Walker |
| 6,600,173 B2 | 7/2003 | Tiwari |
| 6,627,924 B2 | 9/2003 | Hsu et al. |
| 6,649,980 B2 | 11/2003 | Noguchi |
| 6,653,174 B1 | 11/2003 | Cho et al. |
| 6,690,038 B1 | 2/2004 | Cho et al. |
| 6,690,039 B1 | 2/2004 | Nemati et al. |
| 6,713,791 B2 | 3/2004 | Hsu et al. |
| 6,713,810 B1 | 3/2004 | Bhattacharyya |
| 6,727,529 B2 | 4/2004 | Nemati et al. |
| 6,744,094 B2 | 6/2004 | Forbes |
| 6,756,286 B1 | 6/2004 | Moriceau et al. |
| 6,764,774 B2 | 7/2004 | Grill et al. |
| 6,768,156 B1 | 7/2004 | Bhattacharyya |
| 6,809,044 B1 | 10/2004 | Aspar et al. |
| 6,812,504 B2 | 11/2004 | Bhattacharyya |
| 6,815,781 B2 | 11/2004 | Vyvoda et al. |
| 6,841,813 B2 | 1/2005 | Walker et al. |
| 6,845,034 B2 | 1/2005 | Bhattacharyya |
| 6,870,202 B2 | 3/2005 | Oka |
| 6,881,994 B2 | 4/2005 | Lee et al. |
| 6,882,008 B1 | 4/2005 | Ohsawa |
| 6,888,199 B2 | 5/2005 | Nowak et al. |
| 6,891,205 B1 | 5/2005 | Cho et al. |
| 6,906,354 B2 | 6/2005 | Hsu et al. |
| 6,914,286 B2 | 7/2005 | Park |
| 6,934,209 B2 | 8/2005 | Marr |
| 6,940,748 B2 | 9/2005 | Nejad et al. |
| 6,940,761 B2 | 9/2005 | Forbes |
| 6,946,365 B2 | 9/2005 | Aspar et al. |
| 6,953,953 B1 | 10/2005 | Horch |
| 6,958,263 B2 | 10/2005 | Bhattacharyya |
| 6,958,513 B2 | 10/2005 | Wang |
| 6,965,129 B1 | 11/2005 | Horch et al. |
| 6,992,349 B2 | 1/2006 | Lee et al. |
| 6,995,456 B2 | 2/2006 | Nowak |
| 7,015,092 B2 | 3/2006 | Jaiprakash et al. |
| 7,029,956 B2 | 4/2006 | Hsu et al. |
| 7,052,941 B2 | 5/2006 | Lee |
| 7,075,146 B2 | 7/2006 | Forbes |
| 7,081,663 B2 | 7/2006 | Bulucea |
| 7,115,939 B2 | 10/2006 | Forbes |
| 7,120,046 B1 | 10/2006 | Forbes |
| 7,129,538 B2 | 10/2006 | Lee et al. |
| 7,151,024 B1 | 12/2006 | Forbes |
| 7,157,771 B2 | 1/2007 | Forbes |
| 7,158,401 B2 | 1/2007 | Bhattacharyya |
| RE39,484 E | 2/2007 | Bruel |
| 7,180,135 B1 | 2/2007 | Ioannou |
| 7,195,959 B1 | 3/2007 | Plummer et al. |
| 7,205,185 B2 | 4/2007 | Dokumaci et al. |
| 7,250,628 B2 | 7/2007 | Bhattacharyya |
| 7,250,646 B2 | 7/2007 | Walker et al. |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,304,327 B1 | 12/2007 | Nemati et al. |
| 7,323,380 B2 | 1/2008 | Forbes |
| 7,326,969 B1 | 2/2008 | Horch |
| 7,338,862 B2 | 3/2008 | Huo et al. |
| 7,358,120 B2 | 4/2008 | Furukawa et al. |
| 7,359,229 B2 | 4/2008 | Ferrant et al. |
| 7,362,609 B2 | 4/2008 | Harrison et al. |
| 7,368,352 B2 | 5/2008 | Kim et al. |
| 7,378,325 B2 | 5/2008 | Kaneko |
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,525,137 B2 | 4/2009 | Walker et al. |
| 7,538,000 B2 | 5/2009 | Dao |
| 7,560,336 B2 | 7/2009 | Abbott |
| 7,579,240 B2 | 8/2009 | Forbes |
| 7,589,995 B2 | 9/2009 | Tang et al. |
| 7,592,209 B2 | 9/2009 | Chang |
| 7,615,436 B2 | 11/2009 | Kouznetsov et al. |
| 7,619,917 B2 | 11/2009 | Nirschl et al. |
| 7,629,651 B2 | 12/2009 | Nakajima |
| 7,663,188 B2 | 2/2010 | Chung |
| 7,736,969 B2 | 6/2010 | Abbott et al. |
| 7,786,505 B1 | 8/2010 | Yang et al. |
| 7,816,728 B2 | 10/2010 | Ho et al. |
| 7,825,455 B2 | 11/2010 | Lee et al. |
| 7,838,360 B2 | 11/2010 | Forbes |
| 7,851,859 B2 | 12/2010 | Tak et al. |
| 7,883,962 B2 | 2/2011 | Noble |
| 7,897,440 B1 | 3/2011 | Horch |
| 7,929,343 B2 | 4/2011 | Tang |
| 8,018,058 B2 | 9/2011 | Lee |
| 8,084,316 B2 | 12/2011 | Huo et al. |
| 8,102,025 B2 | 1/2012 | Ozeki et al. |
| 8,148,780 B2 | 4/2012 | Tang et al. |
| 8,501,559 B2 | 8/2013 | Tang et al. |
| 8,501,581 B2 | 8/2013 | Tang et al. |
| 8,507,966 B2 | 8/2013 | Tang et al. |
| 8,518,812 B2 | 8/2013 | Mariani et al. |
| 8,519,431 B2 | 8/2013 | Nemati et al. |
| 8,558,220 B2 | 10/2013 | Schricker et al. |
| 8,598,621 B2 | 12/2013 | Tang |
| 8,772,848 B2 | 7/2014 | Zahurak |
| 2001/0002062 A1 | 5/2001 | Noble, Jr. et al. |
| 2001/0024841 A1 | 9/2001 | Noble, Jr. et al. |
| 2001/0026477 A1 | 10/2001 | Manning |
| 2001/0048119 A1 | 12/2001 | Mizuno et al. |
| 2002/0024152 A1 | 2/2002 | Momoi et al. |
| 2002/0028541 A1 | 3/2002 | Lee et al. |
| 2002/0070454 A1 | 6/2002 | Yasukawa |
| 2002/0079537 A1 | 6/2002 | Houston |
| 2002/0081753 A1 | 6/2002 | Gates et al. |
| 2002/0094619 A1 | 7/2002 | Mandelman et al. |

| | | | | | | |
|---|---|---|---|---|---|---|
| 2002/0142562 | A1 | 10/2002 | Chan et al. | 2010/0061145 A1 | 3/2010 | Weis |
| 2002/0158254 | A1 | 10/2002 | Hsu et al. | 2010/0197141 A1 | 8/2010 | Tu et al. |
| 2002/0163019 | A1 | 11/2002 | Mohsen | 2010/0200916 A1 | 8/2010 | Gossner et al. |
| 2002/0185684 | A1 | 12/2002 | Campbell et al. | 2010/0203695 A1 | 8/2010 | Oh et al. |
| 2002/0190265 | A1 | 12/2002 | Hsu et al. | 2010/0207180 A1 | 8/2010 | Lee |
| 2002/0190298 | A1 | 12/2002 | Alsmeier et al. | 2010/0248153 A1 | 9/2010 | Lee et al. |
| 2003/0006461 | A1 | 1/2003 | Tezuka et al. | 2010/0277982 A1 | 11/2010 | Okhonin |
| 2003/0164501 | A1 | 9/2003 | Suzuki et al. | 2011/0006377 A1 | 1/2011 | Lee et al. |
| 2003/0223292 | A1 | 12/2003 | Nejad et al. | 2011/0024791 A1 | 2/2011 | Schulze et al. |
| 2003/0235710 | A1 | 12/2003 | Grill et al. | 2011/0156044 A1 | 6/2011 | Lee et al. |
| 2004/0022105 | A1 | 2/2004 | Ohsawa | 2011/0163357 A1 | 7/2011 | Tan et al. |
| 2004/0130015 | A1 | 7/2004 | Ogihara et al. | 2011/0215371 A1 | 9/2011 | Tang et al. |
| 2004/0159853 | A1 | 8/2004 | Nemati et al. | 2011/0215396 A1 | 9/2011 | Tang et al. |
| 2004/0214379 | A1 | 10/2004 | Lee et al. | 2011/0215407 A1 | 9/2011 | Tang et al. |
| 2004/0262635 | A1 | 12/2004 | Lee | 2011/0215408 A1 | 9/2011 | Tang et al. |
| 2004/0262679 | A1 | 12/2004 | Ohsawa | 2011/0215436 A1 | 9/2011 | Tang et al. |
| 2005/0001232 | A1 | 1/2005 | Bhattacharyya | 2011/0223725 A1 | 9/2011 | Kang et al. |
| 2005/0037582 | A1 | 2/2005 | Dennard et al. | 2011/0223731 A1 | 9/2011 | Chung et al. |
| 2005/0146955 | A1 | 7/2005 | Kajiyama | 2012/0205736 A1 | 8/2012 | Housely et al. |
| 2005/0230356 | A1 | 10/2005 | Empedocles et al. | 2012/0223369 A1 | 9/2012 | Gupta et al. |
| 2005/0282318 | A1 | 12/2005 | Dao | 2012/0223380 A1 | 9/2012 | Lee et al. |
| 2005/0282356 | A1 | 12/2005 | Lee | 2014/0106554 A1 | 4/2014 | Pozzi et al. |
| 2006/0034116 | A1 | 2/2006 | Lam et al. | | | |
| 2006/0071074 | A1 | 4/2006 | Konevecki et al. | FOREIGN PATENT DOCUMENTS | | |
| 2006/0082004 | A1 | 4/2006 | Parekh et al. | | | |
| 2006/0099776 | A1 | 5/2006 | Dupont | CN | 201180011589.X | 8/2014 |
| 2006/0124974 | A1 | 6/2006 | Cabral et al. | CN | 201180011628.6 | 2/2015 |
| 2006/0125011 | A1 | 6/2006 | Chang | EP | 1918998 | 5/2008 |
| 2006/0197115 | A1 | 9/2006 | Toda | EP | 2286206 | 6/2014 |
| 2006/0220134 | A1 | 10/2006 | Huo et al. | EP | 11751053 | 6/2014 |
| 2006/0227601 | A1 | 10/2006 | Bhattacharyya | EP | 11751050 | 11/2014 |
| 2006/0249770 | A1 | 11/2006 | Huo et al. | JP | H02-275663 | 11/1990 |
| 2007/0012945 | A1 | 1/2007 | Sugizaki | JP | H04-64249 | 2/1992 |
| 2007/0018223 | A1 | 1/2007 | Abbott | JP | H04-186815 | 7/1992 |
| 2007/0023805 | A1 | 2/2007 | Wells et al. | JP | H04-283914 | 10/1992 |
| 2007/0029607 | A1 | 2/2007 | Kouznetzov | JP | 06-104446 | 4/1994 |
| 2007/0045709 | A1 | 3/2007 | Yang | JP | H08-088153 | 4/1998 |
| 2007/0057328 | A1 | 3/2007 | Taniguchi et al. | JP | H10-150176 | 6/1998 |
| 2007/0077694 | A1 | 4/2007 | Lee | JP | H11-103035 | 4/1999 |
| 2007/0080385 | A1 | 4/2007 | Kim et al. | JP | 2000-150905 | 5/2000 |
| 2007/0127289 | A1 | 6/2007 | Lee | JP | 2003-030980 | 1/2003 |
| 2007/0215954 | A1 | 9/2007 | Mouli | JP | 2004-03398 | 10/2004 |
| 2007/0252175 | A1 | 11/2007 | Tang et al. | JP | 2005-136191 | 5/2005 |
| 2007/0264771 | A1 | 11/2007 | Ananthan et al. | JP | 2005-327766 | 11/2005 |
| 2008/0003774 | A1 | 1/2008 | Baek | JP | 2007-511895 | 5/2007 |
| 2008/0124867 | A1 | 5/2008 | Brown | JP | 2008-010503 | 1/2008 |
| 2008/0128802 | A1 | 6/2008 | Huo et al. | JP | 2009-531860 | 9/2009 |
| 2008/0149984 | A1 | 6/2008 | Chang et al. | JP | 2011-508979 | 3/2011 |
| 2008/0211023 | A1 | 9/2008 | Shino | KR | 10-0663359 | 10/2006 |
| 2008/0233694 | A1 | 9/2008 | Li | KR | 10-0702014 | 11/2006 |
| 2008/0237776 | A1 | 10/2008 | Abbott | KR | 10-0821456 | 4/2008 |
| 2008/0246023 | A1 | 10/2008 | Zeng et al. | KR | 2009-0043460 | 4/2009 |
| 2008/0299753 | A1 | 12/2008 | Figura et al. | KR | 2009-0054245 | 5/2009 |
| 2009/0003025 | A1 | 1/2009 | Makhleshi et al. | KR | 10-2010-0070835 | 6/2010 |
| 2009/0010056 | A1 | 1/2009 | Kuo et al. | TW | 200802866 | 1/2008 |
| 2009/0014813 | A1 | 1/2009 | Chao et al. | TW | 101104088 | 12/2013 |
| 2009/0022003 | A1 | 1/2009 | Song et al. | TW | 100106777 | 2/2014 |
| 2009/0026522 | A1 | 1/2009 | Ananthan | TW | 100106775 | 6/2014 |
| 2009/0072341 | A1 | 3/2009 | Liu et al. | TW | 1001107759 | 6/2014 |
| 2009/0079030 | A1 | 3/2009 | Cheng et al. | TW | 100106776 | 11/2014 |
| 2009/0108351 | A1 | 4/2009 | Yang et al. | WO | WO 2009/088889 | 7/2009 |
| 2009/0129145 | A1 | 5/2009 | Slesazeck | WO | PCT/US2011/024354 | 9/2011 |
| 2009/0140290 | A1 | 6/2009 | Schulze et al. | WO | PCT/US2011/024376 | 9/2011 |
| 2009/0170261 | A1 | 7/2009 | Lee | WO | PCT/US2011/024387 | 9/2011 |
| 2009/0173984 | A1 | 7/2009 | Wang | WO | PCT/US2012/021438 | 8/2012 |
| 2009/0189228 | A1 | 7/2009 | Zhang et al. | WO | PCT/US2011/024354 | 9/2012 |
| 2009/0200536 | A1 | 8/2009 | Van Schaijk et al. | WO | PCT/US2011/024376 | 9/2012 |
| 2009/0201723 | A1 | 8/2009 | Okhonin et al. | WO | PCT/US2011/024387 | 9/2012 |
| 2009/0207681 | A1 | 8/2009 | Juengling | WO | PCT/US2012/025109 | 9/2012 |
| 2009/0213648 | A1 | 8/2009 | Slesazeck | WO | PCT/US2012/025115 | 10/2012 |
| 2009/0218656 | A1 | 9/2009 | Gonzalez et al. | WO | PCT/US2012/021438 | 8/2013 |
| 2009/0242865 | A1 | 10/2009 | Lung et al. | WO | PCT/US2012/025109 | 9/2013 |
| 2009/0246952 | A1 | 10/2009 | Ishizaka et al. | WO | PCT/US2012/025115 | 9/2013 |
| 2009/0250738 | A1 | 10/2009 | Dyer | | | |
| 2009/0315084 | A1 | 12/2009 | Cha et al. | OTHER PUBLICATIONS | | |
| 2010/0001271 | A1 | 1/2010 | Mieno | | | |
| 2010/0006938 | A1 | 1/2010 | Jang | U.S. Appl. No. 12/419,658, filed Apr. 7, 2009, Tang et al. | | |
| 2010/0008139 | A1 | 1/2010 | Bae | U.S. Appl. No. 12/715,704, filed Apr. 14, 2011, Tang et al. | | |
| 2010/0044670 | A1 | 2/2010 | Ling | U.S. Appl. No. 12/715,743, filed Mar. 2, 2010, Tang et al. | | |

U.S. Appl. No. 12/715,843, filed Mar. 2, 2010, Tang et al.
U.S. Appl. No. 12/715,889, filed Mar. 2, 2010, Tang et al.
U.S. Appl. No. 12/715,922, filed Mar. 2, 2010, Tang et al.
Cho et al., A Novel Capacitor-Less DRAM Cell Using Thin Capacitively-Coupled Thyristor (TCCT), IEEE, 2005, 4 pages.
Nemati et al., A Novel High Density, Low Voltage SRAM Cell with a Vertical NDR Device, IEEE, 1998,2 pages.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of aU-Shaped Si Trench: Effects of the Oxide and Oxide/Si Interface Condition on the Properties of Vertical MOS Devices, Microelectronic Engineering, vol. 72, pp. 247-252; 2004.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol. 154,No. 1, 2007, pp. H20-H25.
Burke et al., "Silicon Carbide Thyristors for Power Applications", pp. 327-335.
Cheong et al., "Investigation of Ultralow Leakage in MOS Capacitors on 4H SiC", IEEE Transactions on Electron Devices, vol. 51(9), Sep. 2004, pp. 1361-1365.
Dimitraiadis et al., "New a-SiC, Optically Controlled, Thyristor-Like Switch", Electronics Letters, vol. 28)17), Aug. 13, 1992, pp. 1622-1624.
Jen et al., "Electrical and Luminescent Characteristics of a-SiC:H P-I-: Thin-Film LED's with Graded-Gap Junctions", IEEE Transactions on Electron Devices, vol. 44(4), Apr. 1997, pp. 565-571.
Powell et al., "SiC Materials—Progress, Status, and Potential Roadblocks", Proceedings of the IEEE, vol. 90(6), Jun. 2002, pp. 942-955.
Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.
U.S. Appl. No. 14/461,689, filed Aug. 18, 2014, Mariani et al.
U.S. Appl. No. 14/461,730, filed Aug. 18, 2014, Zanderigo et al.
U.S. Appl. No. 14/461,751, filed Aug. 18, 2014, Mariani et al.
U.S. Appl. No. 14/265,168, filed Apr. 29, 2014, Righetti et al.
"IBM Builds World's Fastest Communications Microchip", Reuters U.S. Company News, Feb. 25, 2002, http://activequote300.fidelity.com/rtrnews/-individual-n . . . / . . . , 1 pg.
Bae, G.J. et al., "A Novel SiGe-Inserted SOI Structure for High Performance PDSOI CMOSFET", IEDM Tech. Digest, 2000, pp. 667-670.
Belford, et al., Performance-Augmented CMOS Using Back-End Uniaxial Strain, DRC Conf. Digest, 2002, pp. 41-42.
Bhattacharyya, A., "The Role of Microelectronic Integration in Environmental Control: A Perspective", Mat. Res. Soc. Symp. Proc. vol. 344, 1994, pp. 281-293.
Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.
Current, M.I. et al., "Atomic-Layer Cleaving with SixGey Strain Layers for Fabrication of Si and Ge-Rich SOI Device Layers", 2001 IEEE Internatl. SOI Conf. Oct. 2001, pp. 11-12.
Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.
Feder, B.J., "I.B.M. Finds Way to Speed Up Chips", The New York Times, Jun. 8, 2001, reprinted from http://www.nytimes.com/2001/06/08 /technology/08BLUE.html, 2 pgs.
Garone, P.M. et al., "Mobility Enhancement and Quantum Mechanical Modeling in GexSi1-x Channel MOSFETs from 90 to 300K", IEDM Tech. Digest, 1991, pp. 29-32.
Gu, J. et al., "High Performance Sub-100 nm Si Thin-Film Transistors by Pattern-Controlled Crystallization of Thin Channel Layer and High Temperature Annealing", DRC Conf. Digest 2002, pp. 49-50.

Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.
Hara, A. et al., "High Performance Poly-Si TFTs on a Glass by a Stable Scanning CW Laser Lateral Crystallization", IEDM Tech. Digest, 2001, pp. 747-750.
Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.
Jagar, S. et al., "Single Grain Thin-Fim-Transistor (TFT) with SOI CMOS Performance Formed by Metal-Induced-Lateral-Crystallization", IEDM Tech. Digest, 1999, p. 293-6.
Jeon, J. et al., "A New Poly-Si TFT with Selectively Doped Channel Fabricated by Novel Excimer Laser Annealing", IEDM Tech. Digest, 2000, pp. 213-216.
Kesan, V. et al., "High Performance 0.25 µm p-MOSFETs with Silicon-Germanium Channels for 300K and 77K Operation", IEDM Tech. Digest, 1991, pp. 25-28.
Kim, C.H. et al., "A New High-Performance Poly-Si TFT by Simple Excimer Laser Annealing on Selectively Floating a-Si Layer", IEDM Tech. Digest, 2001, pp. 751-754.
King, T. et al, "A Low-Temperature (?550° C.) Silicon-Germanium MOS Thin-Film Transistor Technology for Large-Area Electronics", IEDM Tech. Digest, 1991, pp. 567-570.
Kuriyama, H. et al., "High Mobility Poly-Si TFT by a New Excimer Laser Annealing Method for Large Area Electronics", IEDM Tech. Digest, 1991, pp. 563-566.
Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, Natl. Science Council of Taiwan., pp. 1, 9.
Lu, N. C.C. et al., "A Buried-Trench DRAM Cell Using a Self-Aligned Epitaxy Over Trench Technology", IEDM Tech. Digest, 1988, pp. 588-591.
Markoff, J., "I.B.M. Circuits are Now Faster and Reduce Use of Power", The New York Times, Feb. 25, 2002, reprinted Mar. 20, 2002, from http://story.news.yahoo.com/ news?tmpl=story&u=/nyt/20020225/ . . . , 1 pg.
Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.
Myers, S.M. et al., "Deuterium Interactions in Oxygen-Implanted Copper", J. Appl. Phys., vol. 65(1),. Jan. 1, 1989, p. 311-321.
Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.
Ono, K. et al., "Analysis of Current-Voltage Characteristics in Polysilicon TFTs for LCDs", IEDM Tech. Digest, 1988, pp. 256-259.
Park, et al., "Normal Incident SiGe/Si Multiple Quantum Well Infrared Detector", IEDM Tech. Digest, 1991, pp. 749-752.
Rim, K. et al., "Characteristics and Device Design of Sub-100 nm Strained SiN- and PMOSFETs", 2002 Sympos. on VLSI Tech. Digest of Technical Papers, pp. 98-99.
Rim, K. et al., "Strained Si NMOSFET's for High Performance CMOS Technology", 2001 Sympos. on VLSI Tech. Digest of Technical Papers, p. 59-60.
Saggio, M. et al., "Innovative Localized Lifetime Control in High-Speed IGBT's", IEEE Elec. Dev. Lett., V. 18, No. 7, Jul. 1997, pp. 333-335.
Shima, M. et al., "<100> Channel Strained-SiGe p-MOSFET with Enhanced Hole Mobility and Lower Parasitic Resistance", 2002 Sympos. on—VLSI Tech. Digest of Technical Papers, pp. 94-95.
Takagi, Strained-Si- and SiGe-on-Insulator (Strained SOI and SGOI) MOSFETs for High Performance/Low Power CMOS Application, DRC Conf. Digest, 2002, pp. 37-40.
Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.
Tzeng et al., "Dry Etching of Silicon Materials in SF6 Based Plasmas", J. Electrochem. Soc., 1987 vol. 134, issue 9, pp. 2304-2309.

van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Yamada, T. et al., "Spread Source/Drain (SSD) MOSFET Using Selective Silicon Growth for 64Mbit DRAMs", IEDM Tech. Digest, 1989, pp. 35-38.

Yamauchi, N. et al., "Drastically Improved Performance in Poly-Si TFTs with Channel Dimensions Comparable to Grain Size", IEDM Tech. Digest, 1989, pp. 353-356.

Burke et al., "Silicon Carbide Thyristors for Power Applications", Pulsed Power Conference 1995, Digest of Technical Papers, 10th IEEE International vol. 1, United States, pp. 327-335.

US 9,129,983 B2

MEMORY CELLS, MEMORY ARRAYS, METHODS OF FORMING MEMORY CELLS, AND METHODS OF FORMING A SHARED DOPED SEMICONDUCTOR REGION OF A VERTICALLY ORIENTED THYRISTOR AND A VERTICALLY ORIENTED ACCESS TRANSISTOR

RELATED PATENT DATA

This patent resulted from a divisional of U.S. patent application Ser. No. 13/025,591, filed Feb. 11, 2011, entitled "Memory Cells, Memory Arrays, Methods Of Forming Memory Cells, And Methods Of Forming A Shared Doped Semiconductor Region Of A Vertically Oriented Thyristor And A Vertically Oriented Access Transistor" naming Sanh D. Tang as inventor, the disclosure of which is incorporated by reference

TECHNICAL FIELD

Embodiments disclosed herein pertain to memory cells, to memory arrays, to methods of forming memory cells, and to methods of forming a shared doped semiconductor region of a vertically oriented thyristor and a vertically oriented access transistor.

BACKGROUND

Many integrated circuit (IC) memory devices conventionally include static random access memory (SRAM). Conventional SRAM is based on four-transistor memory cells (4T SRAM cells) or six-transistor memory cells (6T SRAM cells) that are compatible with conventional memory elements, such as complementary metal-oxide-semiconductor (CMOS) devices, operate at low voltage levels, and perform at relatively high speeds. However, conventional SRAM consumes a large cell area that limits high-density design of SRAM.

In attempts to reduce the area of IC memory devices, high-density, low-voltage SRAM cells including four layers of alternating n- and p-type semiconductive material, often referred to as a "thin capacitively-coupled thyristor (TCCT)" have been fabricated. As used herein, the term "thyristor," means and includes a bi-stable, three-terminal device that includes a four layer structure including a p-type anode region, an n-type base, a p-type base, and an n-type cathode region arranged in a p-n-p-n configuration. The thyristor may include two main terminals, an anode and a cathode. Further, a control terminal, often referred to as the "gate," may be operatively adjacent to the p-type material nearest the cathode. Thyristor-based random access memory (T-RAM) cells demonstrate faster switching speeds and lower operating voltages in comparison to conventional SRAM cells.

A thyristor in a memory device may be turned on by biasing the gate so that a p-n-p-n channel conducts a current. Once the device is turned on, often referred to as "latched," the thyristor does not require the gate to be biased to maintain the current conducted between the cathode and the anode. Instead, it will continue to conduct until a minimum holding current is no longer maintained between the anode and cathode, or until the voltage between the anode and the cathode is reversed. Accordingly, the thyristor may function as a switch or diode capable of being switched between an "on" state and an "off" state.

DETAILED DESCRIPTION OF EXAMPLE EMBODIMENTS

Figure 1:
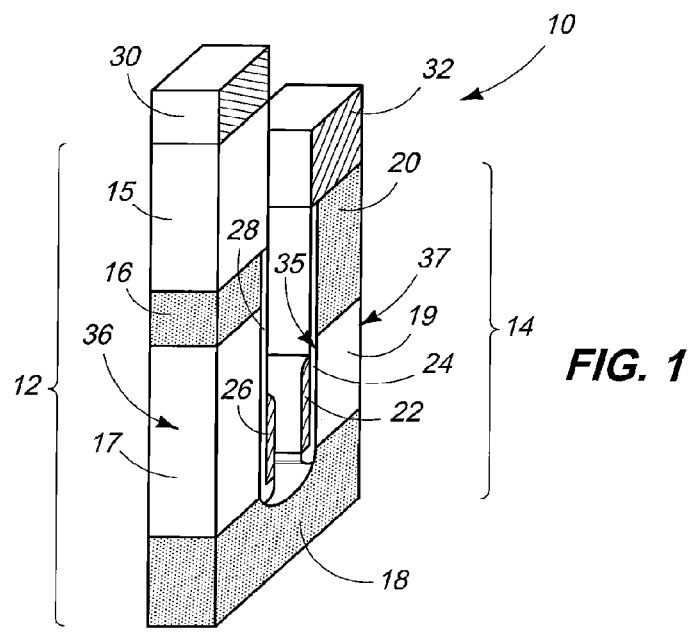
FIG. 1 is a diagrammatic oblique projection view of a memory cell in accordance with an embodiment of the invention.
Figure 2:
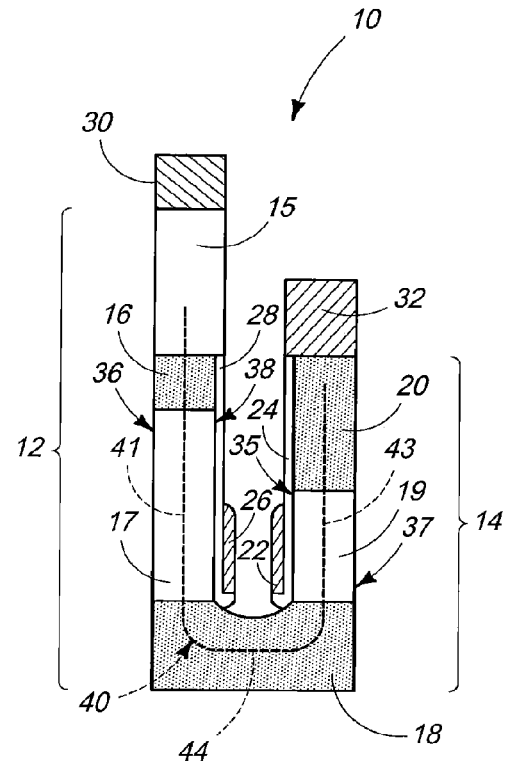
FIG. 2 is a side elevational view of the memory cell of FIG. 1.

Some example embodiments of memory cells in accordance with the invention are initially described with respect to a memory cell 10 in FIGS. 1 and 2. In one embodiment, such comprises at least one thyristor 12 and at least one vertically oriented access transistor 14.

Memory cell 10 may be fabricated relative to a suitable base substrate (not shown) which may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material received elevationally inward of the dielectric material. In this document, vertical is a direction generally orthogonal to a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction from the base substrate upon which the circuitry is fabricated. The base substrate may or may not be a semiconductor substrate. In this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Thyristor 12 may comprise a plurality of alternately doped, vertically superposed semiconductor regions 15, 16, 17, and 18. Vertically oriented access transistor 14 may comprise a plurality of alternately doped, superposed semiconductor regions 18, 19, and 20. Accordingly in some embodiments, thyristor 12 and access transistor 14 share one of the alternately doped, superposed semiconductor regions, for example region 18 in FIGS. 1 and 2. As used herein, the term "vertically superposed" means and includes materials or regions which are disposed elevationally atop or situated one upon another. Lateral perimeters thereof might generally coincide. Further, "alternately doped" means and includes with respect to the stated regions opposite n and p conductivity type disposed in succession one after the other. Material of respective regions 15-20 may be homogenous or non-homogenous, and may comprise any existing or yet-to-be-developed semiconductor material. Crystalline silicon material, silicon germanium material, gallium arsenide material, and/or gallium nitride material are some examples.

Semiconductor regions 15, 18, and 20 may be "highly doped" to the same or different respective n or p dopant concentration(s). Semiconductor regions 16, 17, and 19 may not be highly doped, and may be of the same or different dopant concentration(s). As used herein, the term "highly doped" means and includes a material or region having a higher concentration of a dopant than those which are not highly doped. With respect to thyristor 12, region 15 may be a p-type anode region, region 16 an n-type base region, region 17 a p-type base region, and region 18 an n-type cathode region.

In one embodiment, access transistor 14 has an access gate 22 which is operatively laterally adjacent an unshared of the semiconductor regions of the access transistor, for example region 19 as shown. A suitable gate dielectric 24 is received between at least access gate 22 and region 19, with such also in the example embodiment extending over a portion of shared region 18 and laterally over semiconductor region 20. A control gate 26 is spaced laterally of access gate 22, and is operatively laterally adjacent one of the alternately doped, vertically superposed semiconductor regions, for example unshared region 17 as shown. A suitable gate dielectric 28 is received between at least control gate 26 and semiconductor region 17, with gate dielectric 28 in the example embodiment extending over shared semiconductor region 18 and laterally over semiconductor region 16. Gate dielectrics 24 and 28 may be homogenous or non-homogenous, and of the same or different composition(s). Gates 22 and 26 comprise current conductive material, and may be homogenous or non-homogenous. In this document, "current conductive material" is a composition where electric current flow would inherently occur therein predominantly by movement by subatomic positive and/or negative charges when such are generated as opposed to predominantly by movement of ions. Example current conductive materials are elemental metals, alloys of elemental metals, current conductive metal compounds, and conductively doped semiconductive material, including any combination thereof.

In one embodiment, the access gate and the control gate elevationally overlap, and in one embodiment, are elevationally coincident. In this document, constructions "elevationally overlap" if some respective portions thereof are elevationally at the same level. Elevationally overlapping constructions are "elevationally coincident" if their elevationally outermost and innermost extents/surfaces are elevationally at the same level.

An electrode 30 may be in current conductive connection with semiconductor region 15, and an electrode 32 may be in current conductive connection with semiconductor region 20. Each may comprise current conductive material, and may be homogenous or non-homogenous.

In one embodiment of the invention, a memory cell comprises a vertically oriented thyristor and a control gate operatively laterally adjacent thereto. Such also includes a vertically oriented access transistor laterally spaced from the vertically oriented thyristor and which shares a doped semiconductor region therewith that extends laterally between the vertically oriented thyristor and the vertically oriented access transistor. That which is depicted in FIGS. 1 and 2 is but one such example embodiment.

Figure 3:
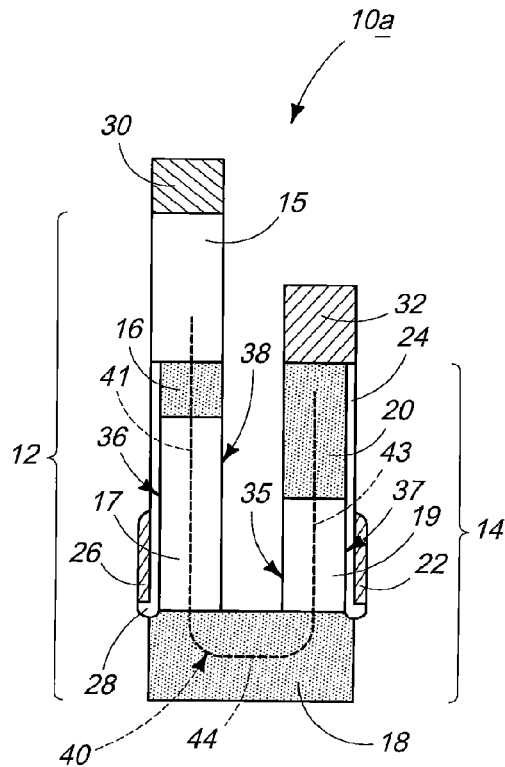
FIG. 3 is a side elevational view of a memory cell in accordance with an embodiment of the invention.

In one embodiment, a vertically oriented access transistor comprises a channel region having a pair of laterally opposing sides, with the access gate being operatively laterally adjacent only one of such sides. Memory cell 10 is an example such memory cell wherein semiconductor region 19 comprises a channel region having a pair of laterally opposing sides 35 and 37, with access gate 22 being operatively laterally adjacent only the one side 35. FIG. 3 depicts an alternate example embodiment memory cell 10a wherein access gate 22 and gate dielectric 24 are received operatively laterally adjacent only the one side 37 of semiconductor region 19.

In one embodiment, the one of the alternately doped, vertically superposed semiconductor regions which the control gate is operatively laterally adjacent has a pair of laterally opposing sides, with the control gate only being so adjacent one of such sides. For example with respect to memory cell 10 in FIG. 2, semiconductor region 17 has a pair of laterally opposing sides 36 and 38, with control gate 22 being operatively laterally adjacent only the side 38. FIG. 3 depicts an alternate example embodiment wherein control gate 26 is adjacent only the one side 36. FIGS. 1-3 depict but two example embodiments wherein gates 22 and 26 are only on one respective side of a channel region. Of course, access gate 22 may alternately be over side 35 in FIG. 3 (not shown), or control gate 26 could be over side 38 in FIG. 3 (not shown).

Figure 4:
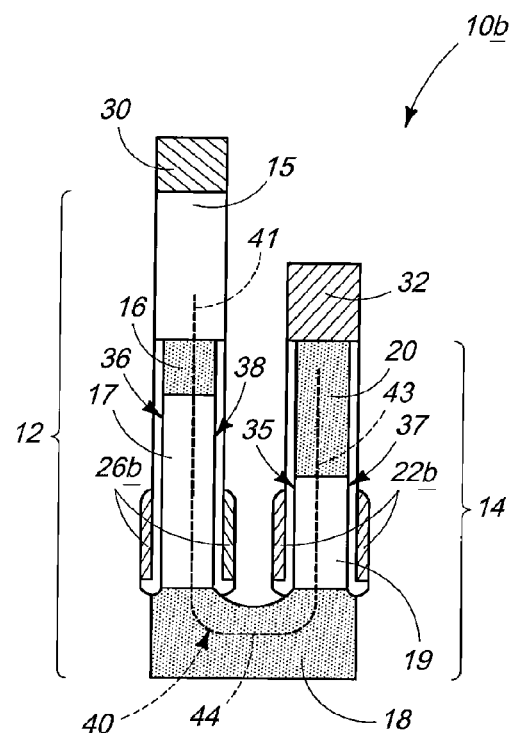
FIG. 4 is a side elevational view of a memory cell in accordance with an embodiment of the invention.

In one embodiment, the access gate may comprise a pair of such gates with one of each being received operatively laterally adjacent one of the pair of laterally opposing sides of the channel region. Additionally or alternately, the control gate may comprise a pair of such gates with one of each being received operatively laterally adjacent one of the pair of laterally opposing sides of one of the vertically superposed, alternately doped semiconductor regions of the thyristor. For example, FIG. 4 depicts such a memory cell 10b. Like numerals from the above-described embodiments have been used where appropriate, with some construction differences being shown with the letter "b". Memory cell 10b includes a pair of access gates 22b and a pair of control gates 26b. In one embodiment, access gates 22b may be hard-wired together. In one embodiment, control gates 26b may be hard-wired together. Regardless, any of the FIGS. 1 and 2 embodiment and the FIG. 3 embodiment may be combined wherein either the access gate or control gate comprises a pair of such gates on opposing lateral sides with the other comprising only a single gate on only one lateral side.

In one embodiment, a memory cell comprises a plurality of alternately doped, superposed semiconductor regions at least an elevationally inner portion of which forms an upwardly directed container shape in lateral cross section. The semiconductor regions collectively comprise serially electrically connectable portions of a thyristor and an access transistor of the memory cell and which share one of the doped semiconductor regions. An access gate is operatively laterally adjacent an unshared of the semiconductor regions of the access transistor. A control gate is operatively laterally adjacent an unshared of the semiconductor regions of the thyristor. By way of example only, any of the embodiments of FIGS. 1-4 as shown and described are such example memory cells.

For example with respect to the depicted memory cells, an elevationally inner upwardly directed container shape in lateral cross section of semiconductor regions 15-20 is indicated generally with reference numeral 40. In one embodiment and as shown, the upwardly directed container shape is in the form of a general U-shape. "V" and/or other upwardly directed container shapes may be used. In one embodiment, the access gate is received laterally within the upwardly directed container shape (i.e., FIGS. 1, 2, and 4), and in one embodiment is not received laterally outside of the upwardly directed container shape (i.e., FIGS. 1 and 2). In one embodiment, the access gate is received laterally outside of the upwardly directed container shape (i.e., FIGS. 3 and 4), and in one embodiment is not received laterally within the upwardly directed container shape (i.e., FIG. 3). In one embodiment, the access gate comprises a pair of access gate portions, one of which is received laterally within the upwardly directed container shape and another of which is received laterally outside the upwardly directed container shape (i.e., FIG. 4). Any one or combination of the just-described lateral orientations with respect to the access gate may additionally or alternately occur with respect to the control gate.

In one embodiment, the container shape as a general U-shape has a pair of vertical stems having a base extending laterally there-between in the lateral cross section, with one of the stems being taller than the other. For example with respect to the embodiments of FIGS. 1-4, U-shape 40 may be considered as having vertical stems 41 and 43 having a base 44 extending laterally there-between. Vertical stem 41 is taller than vertical stem 43. Alternately by way of examples only, the height of the respective stems could be reversed whereby a stem 43 of the access transistor is taller (not shown) than a stem 41 of the thyristor, or such stems may be of equal height/tallness (not shown). Regardless, other attributes as described above may be used.

Embodiments of the invention encompass a memory array comprising a horizontal array of memory cells, with one such example memory array 50 that includes memory cells 10 being shown and described with reference to FIG. 5. Like numerals from FIGS. 1 and 2 have been used in FIG. 5 where appropriate, with some construction differences and additions being indicated with different numerals. Array 50 is received over some suitable base substrate 51, and comprises a plurality of thyristors 12 substantially aligned in a plurality of rows 52 in a first direction "x" and in a plurality of columns 54 in a second direction "y" that angles relative to the first direction "x". In one embodiment as shown, "x" and "y" are perpendicular. Individual of the thyristors comprise a plurality of alternately doped, vertically superposed semiconductor regions, for example regions 15-18.

Array 50 includes a plurality of vertically oriented access transistors 14 substantially aligned in a plurality of rows 56 in first direction "x" and in a plurality of columns 54 in second direction "y". Accordingly in one embodiment, thyristor columns 54 and access transistor columns 54 may be the same. Individual of the access transistors have an access gate which comprises a portion of individual conductive access gate lines 58 oriented in a plurality of rows in first direction "x". A control gate is operatively laterally adjacent one of the plurality of vertically superposed, alternately doped semiconductor regions of individual of the plurality of thyristors 12, for example control gates 26 which are operatively laterally adjacent respective semiconductor regions 17. Individual of the control gates comprise a portion of individual conductive control gate lines 60 oriented in a plurality of rows in first direction "x". In one embodiment, the thyristors are vertically taller than the access transistors. In one embodiment, the access gate lines are spaced laterally of the control gate lines, and in one embodiment alternate one after the other across the horizontal array in second direction "y". In one embodiment, the access gate lines and control gate lines elevationally overlap, and in one embodiment are elevationally coincident. Regardless, the rows, columns, and/or lines therein may be straight linear as shown or curvilinear (not shown).

A plurality of cathode lines 62 are substantially aligned in a plurality of rows in first direction "x" elevationally outward of access gate lines 58 and elevationally outward of control gate lines 60. Cathode lines 62 may be homogenous or non-homogenous, and comprise current conductive material. A plurality of anode lines 64 are substantially aligned in a plurality of columns in second direction "y" elevationally outward of control gate lines 60 and elevationally outward of access gate lines 58. Regardless, lines 62 and/or 64 may be straight linear as shown or curvilinear (not shown).

Figure 5:
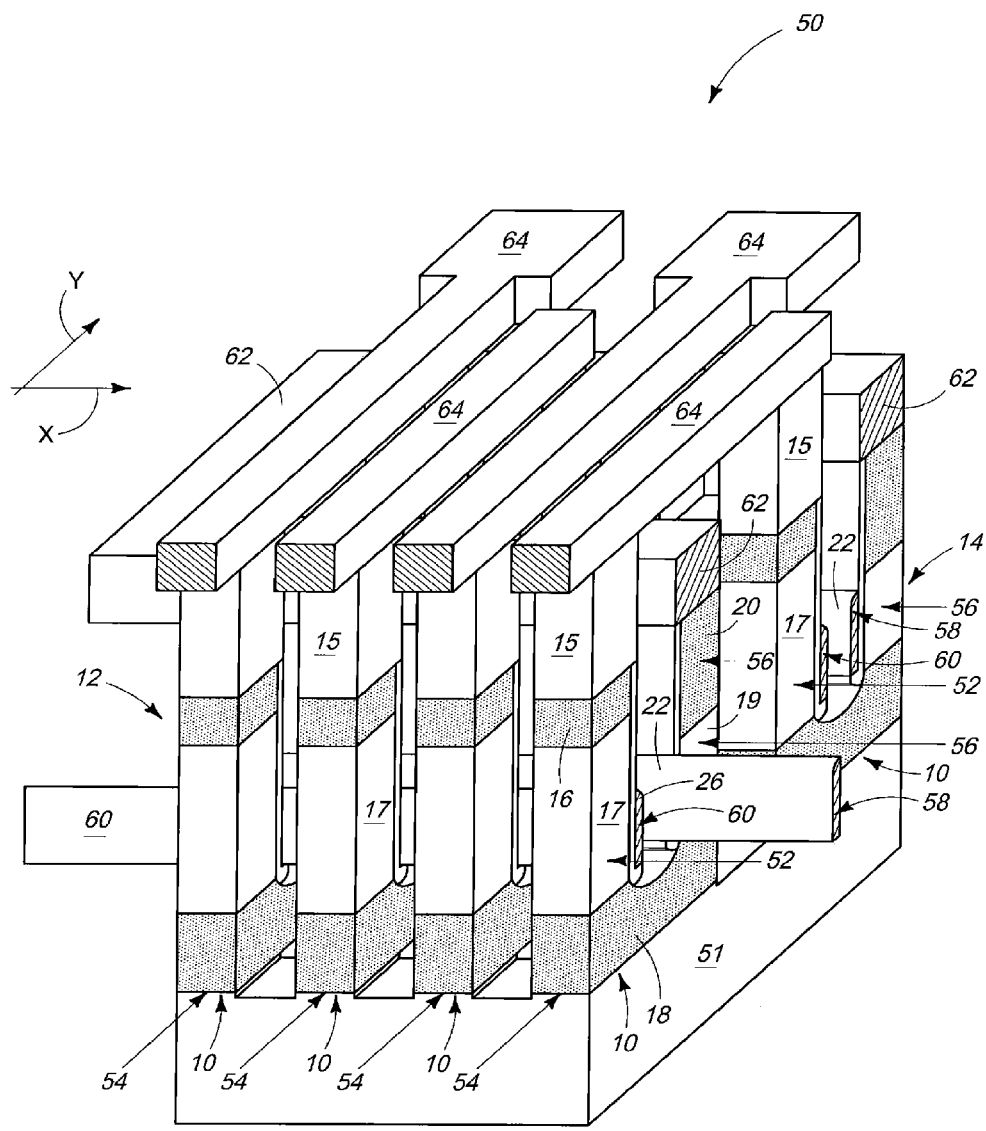
FIG. 5 is a diagrammatic oblique projection view of a portion of a horizontal array of memory cells in accordance with an embodiment of the invention.

FIG. 5 depicts an example embodiment wherein anode lines 64 are elevationally outward of cathode lines 62. Alternately, the cathode lines may be elevationally outward of the anode lines (not shown). In one embodiment, the cathode lines are elevationally outward of the vertically oriented access transistors. In one embodiment, the anode lines are elevationally outward of the thyristors. Any other attribute as described above with respect to the FIGS. 1 and 2, or other embodiments, may be used.

Figure 6:
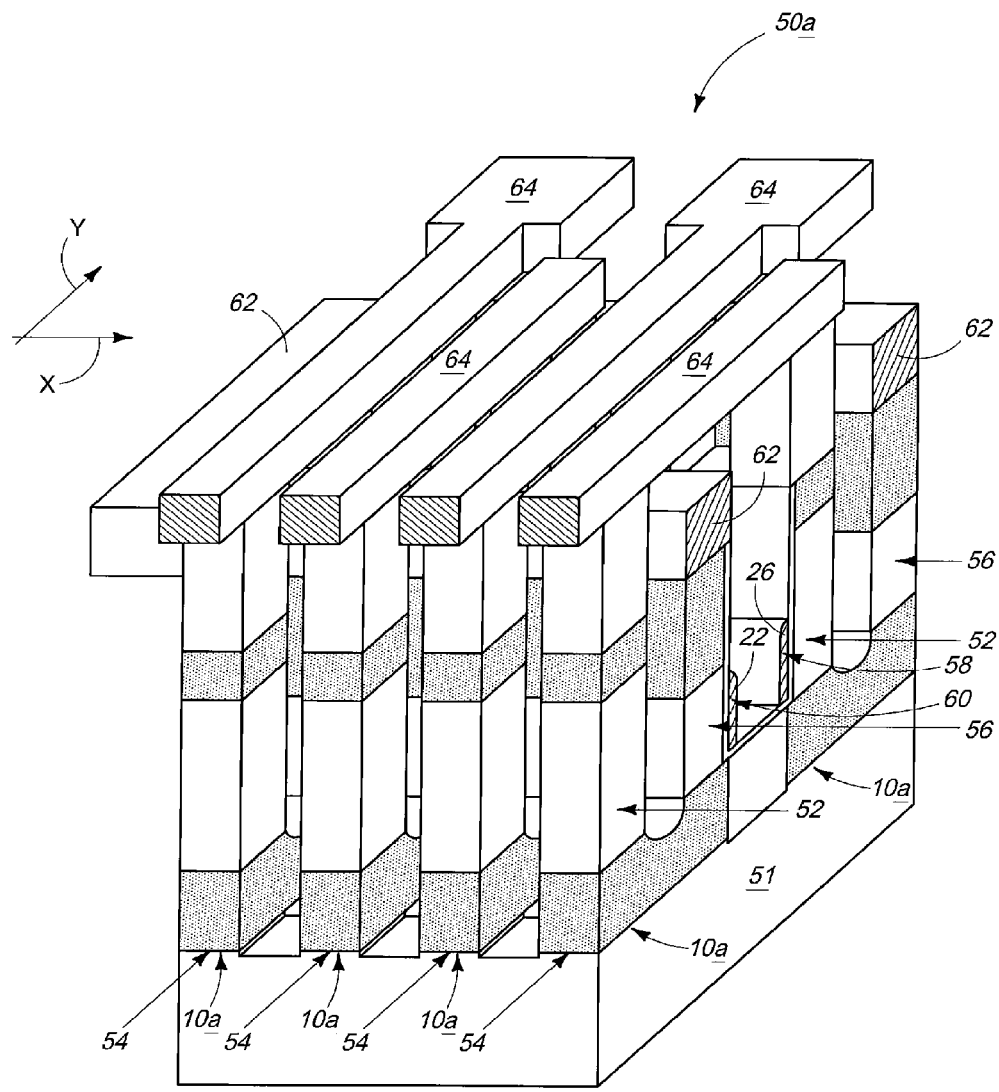
FIG. 6 is a diagrammatic oblique projection view of a portion of another horizontal array of memory cells in accordance with an embodiment of the invention.

FIG. 6 by way of example only, depicts another example memory array 50a comprising a horizontal array of the example memory cells 10a of the FIG. 3 embodiment. Like numerals from the FIGS. 3 and 5 embodiments have been used where appropriate. Any of the above just-described attributes with respect to the memory array embodiment of FIG. 5 may also be used in the FIG. 6 embodiment.

Figure 7:
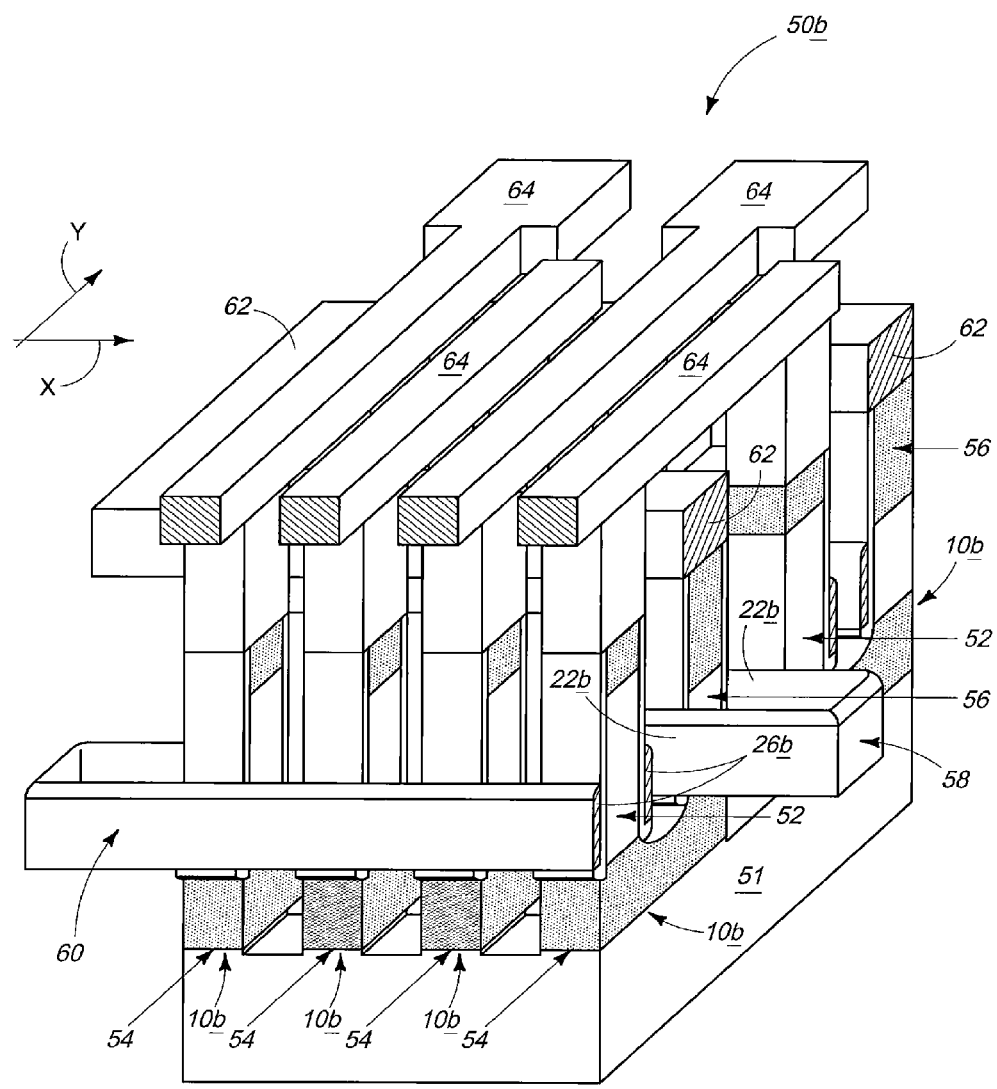
FIG. 7 is a diagrammatic oblique projection view of a portion of another horizontal array of memory cells in accordance with an embodiment of the invention.

FIG. 7 depicts another alternate embodiment memory array 50b incorporating memory cells 10b of FIG. 4. Like numerals from the FIGS. 4 and 5 embodiments have been used where appropriate. As an example, control gate lines 60/26b and access gate lines 58/22b are respectively shown as being hard-wired relative each other. FIG. 7 also depicts an example embodiment wherein access gate lines and control gate lines are spaced laterally apart, with the access gate lines and control gate lines alternating in pairs across the horizontal array in second direction "y". Other attributes as described above with respect to the array embodiments of FIGS. 5 and 6 might additionally or alternately be used in connection with the FIG. 7 array 50b.

The above embodiments of memory cells and memory arrays may be fabricated by any existing or yet-to-be-developed manner(s). Nevertheless, embodiments of the invention encompass methods of forming one or more memory cells which may or may not encompass some of the structural attributes described above. Accordingly, the method subject matter provided herein is not necessarily limited by the structure subject matter, nor is the structure subject matter as just-described necessarily limited by the method by which such structure(s) may be fabricated.

Figure 8:
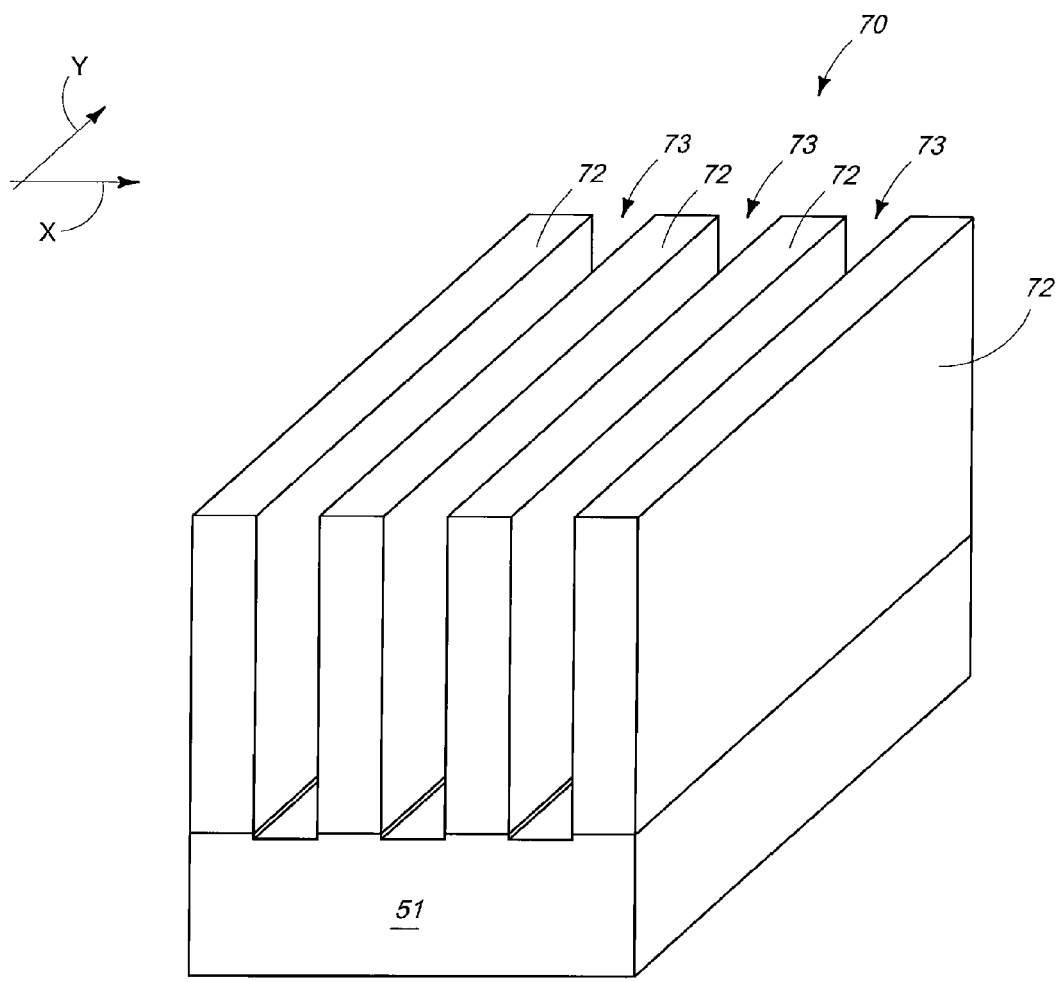
FIG. 8 is a diagrammatic oblique projection view of a substrate fragment in process in accordance with an embodiment of the invention.

An embodiment of the invention encompasses a method of forming a memory cell comprising a vertically oriented thyristor and a control gate operatively laterally adjacent thereto. Such memory cell also comprises a vertically oriented access transistor which shares a doped semiconductor region with the thyristor. One such method is described by way of example only with reference to FIGS. 8-21 with respect to fabricating array 50 of FIG. 5. Accordingly, like numerals from the FIGS. 1, 2 and 5 embodiments have been used where appropriate, with some construction differences or construction precursors being indicated with different numerals. FIG. 8 depicts a substrate fragment 70 comprising, for example, a base 51 having semiconductor material 72 formed thereover. Trenches 73 have been etched through semiconductor material 72, whereby material 72 remains as plates or fins oriented in the "y" direction. Such are shown as being straight rectangular, although other shapes including curved or arcuate shapes might alternately or additionally be used.

Figure 9:
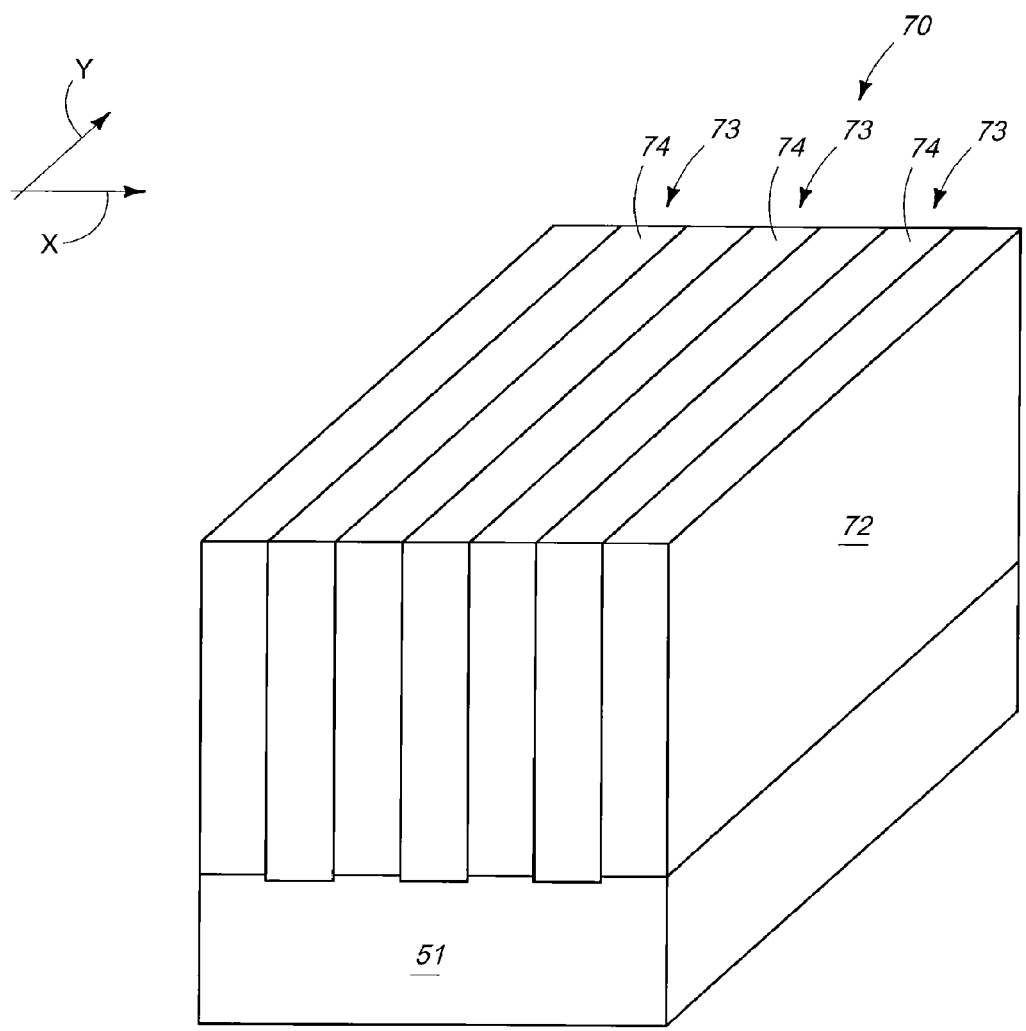
FIG. 9 is a view of the FIG. 8 substrate fragment at a processing step subsequent to that shown by FIG. 8.

Referring to FIG. 9, gaps 73 have been filled with dielectric material 74 which has then been planarized back. Any suitable dielectric material may be used, with doped or undoped silicon dioxide, silicon nitride, etc. being examples. Any masking material (not shown) which may have been used to produce the structure of FIG. 8 may be received over semiconductor material 72 in the structure of FIG. 9.

Figure 10:
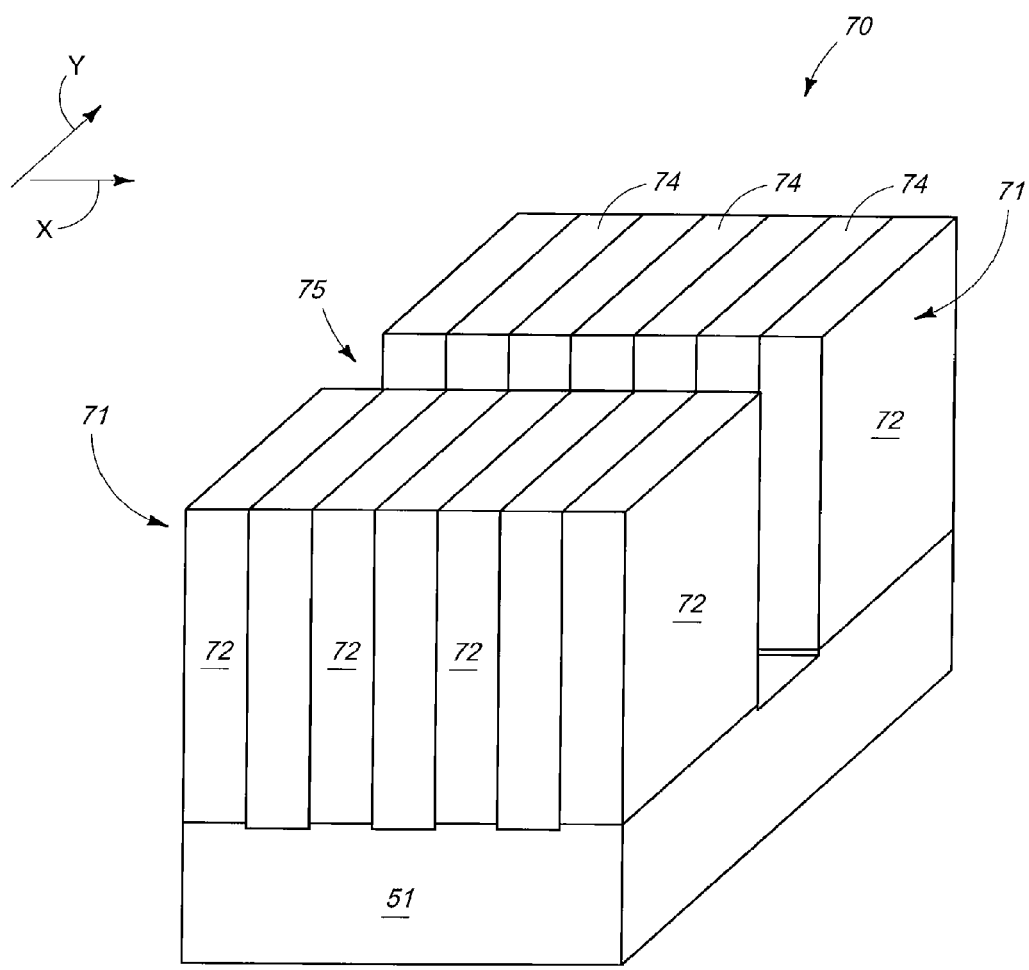
FIG. 10 is a view of the FIG. 9 substrate fragment at a processing step subsequent to that shown by FIG. 9.

Referring to FIG. 10, substrate 70 has been patterned orthogonally to the pattern depicted by FIG. 8, thereby forming blocks 71 of alternating semiconductor material and dielectric material having trenches 75 (only one being shown) formed between blocks 71.

Figure 11:
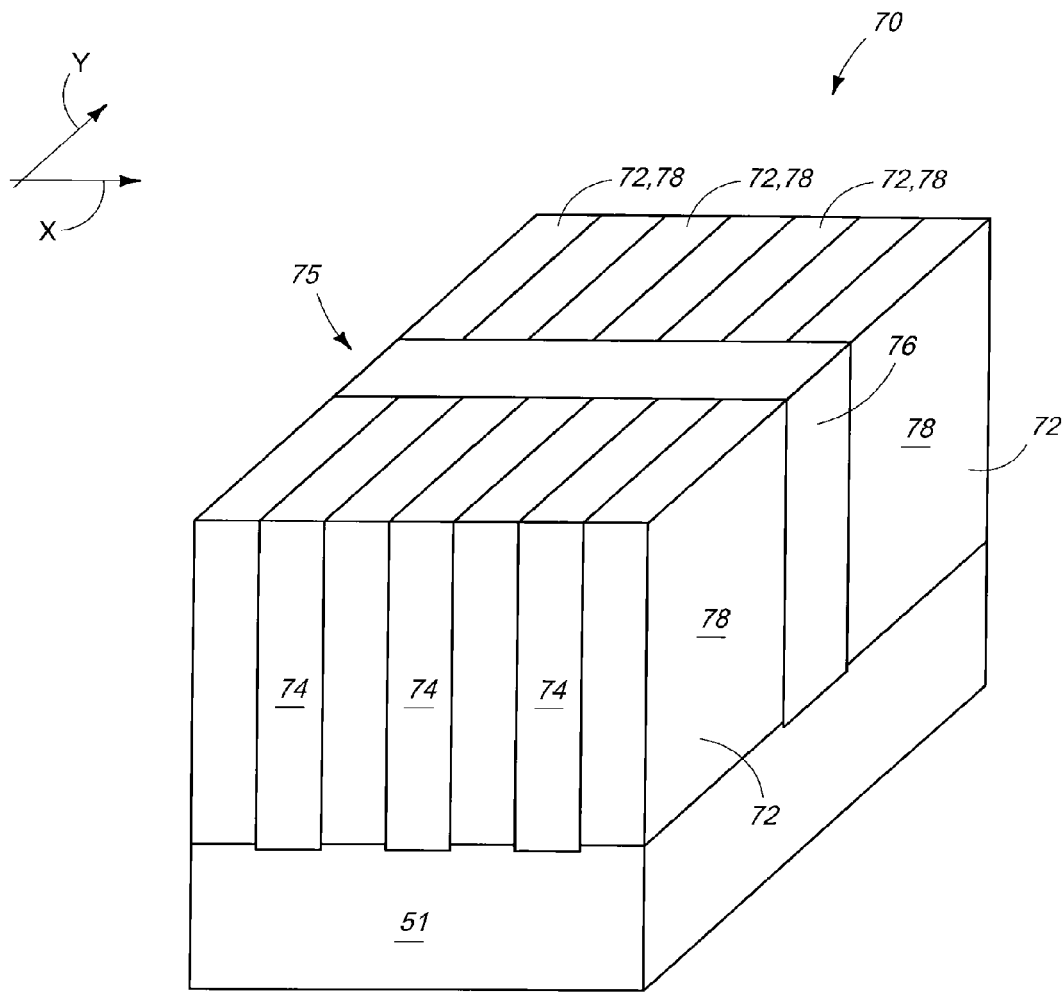
FIG. 11 is a view of the FIG. 10 substrate fragment at a processing step subsequent to that shown by FIG. 10.

Referring to FIG. 11, trench 75 has been filled with dielectric material 76. Examples include those described above with respect to dielectric material 74. In one embodiment, materials 74 and 76 may be of the same composition or at least be capable of being etched at substantially the same rate relative one another. Regardless, the processing through FIG. 11 depicts but one example of forming a block 78 of semiconductor material 72 over a substrate, with multiple such blocks 78 being shown.

Figure 12:
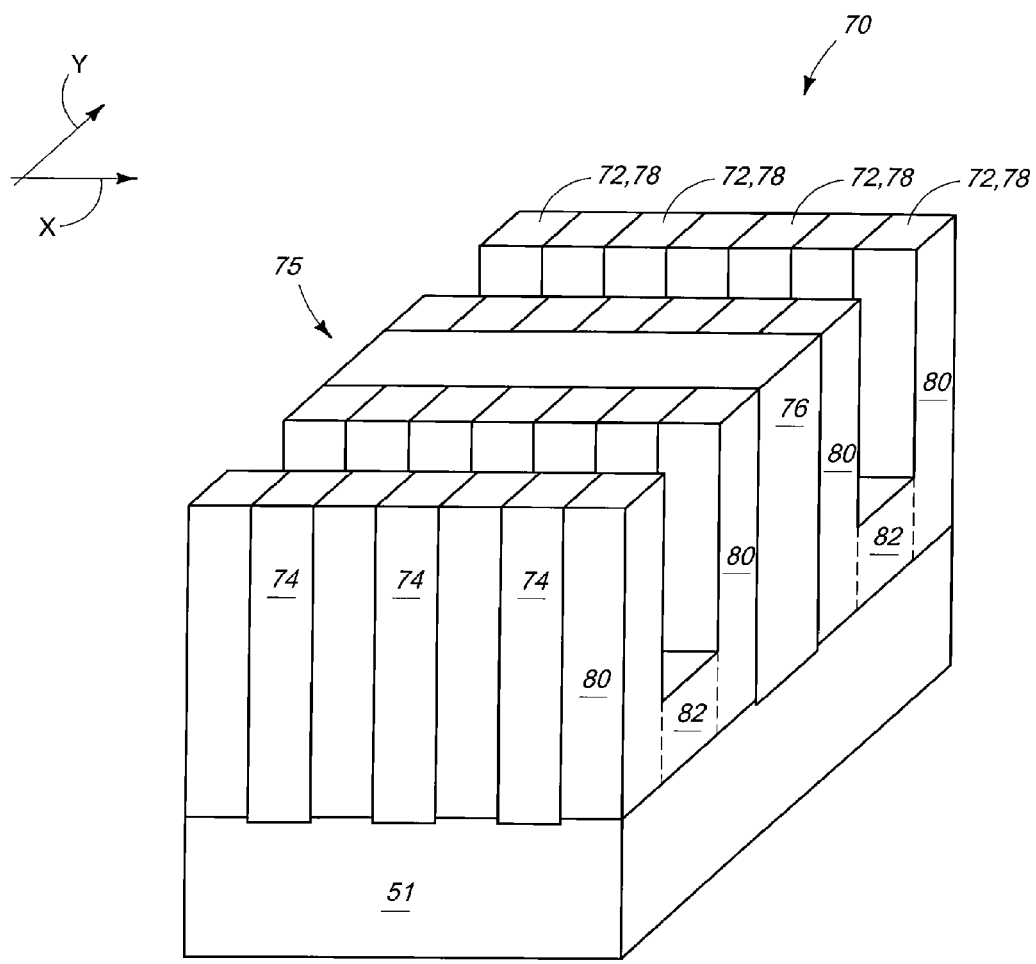
FIG. 12 is a view of the FIG. 11 substrate fragment at a processing step subsequent to that shown by FIG. 11.

Referring to FIG. 12, blocks 78 have been etched into to form an upwardly directed container shape (in the depicted embodiment a general U-shape) of semiconductor material 72 in lateral cross section with respect to individual blocks. In one embodiment where the container shape is of a general U-shape, such has a pair of vertical stems 80 having a base 82 extending laterally there-between in such lateral cross section. As an example, suitable masking material (not shown) may be provided over the outer surfaces of the structure of FIG. 12. Openings may be formed there-through which correspond in lateral and longitudinal dimensions to the trenches formed in FIG. 12, for example by etching, to produce the depicted cross-sectional upwardly directed container shape. Etching may be conducted, for example, to leave a thickness of base 82 of from about 20 nanometers to 50 nanometers. Materials 72 and 74 may be etched simultaneously and/or sequentially.

Figure 13:
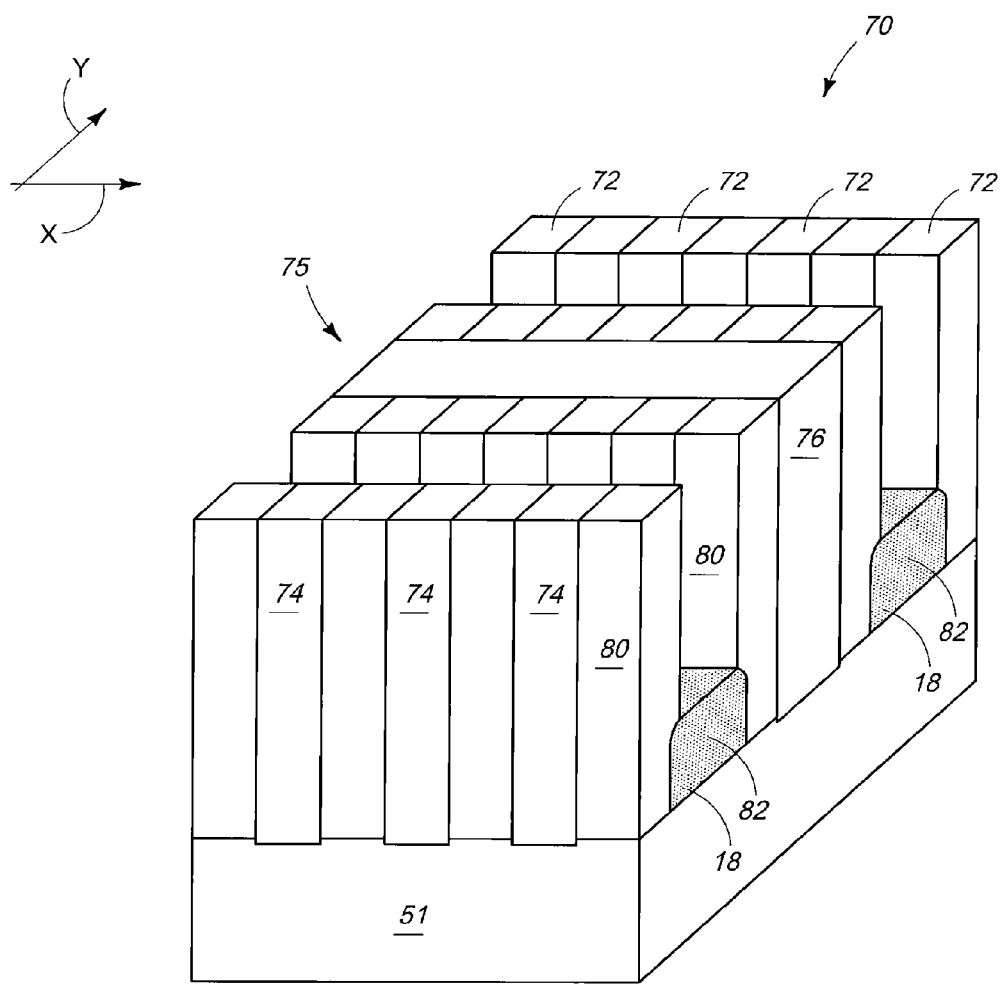
FIG. 13 is a view of the FIG. 12 substrate fragment at a processing step subsequent to that shown by FIG. 12.

Referring to FIG. 13, base 82 between stems 80 has been ion implanted with a conductivity modifying impurity of a first type to a first impurity concentration, for example to comprise region 18. The depicted laterally inner facing sidewalls within the container shape and the elevationally outer surfaces of the FIG. 13 structure may be masked (not shown) during such ion implanting. During or after such ion implanting, the conductivity modifying impurity may spread laterally, for example as shown. In one embodiment, the first type is n, with example dopant implant species being phosphorous and/or arsenic. Alternately, the first type may be p, with an example dopant implant species being boron.

Figure 14:
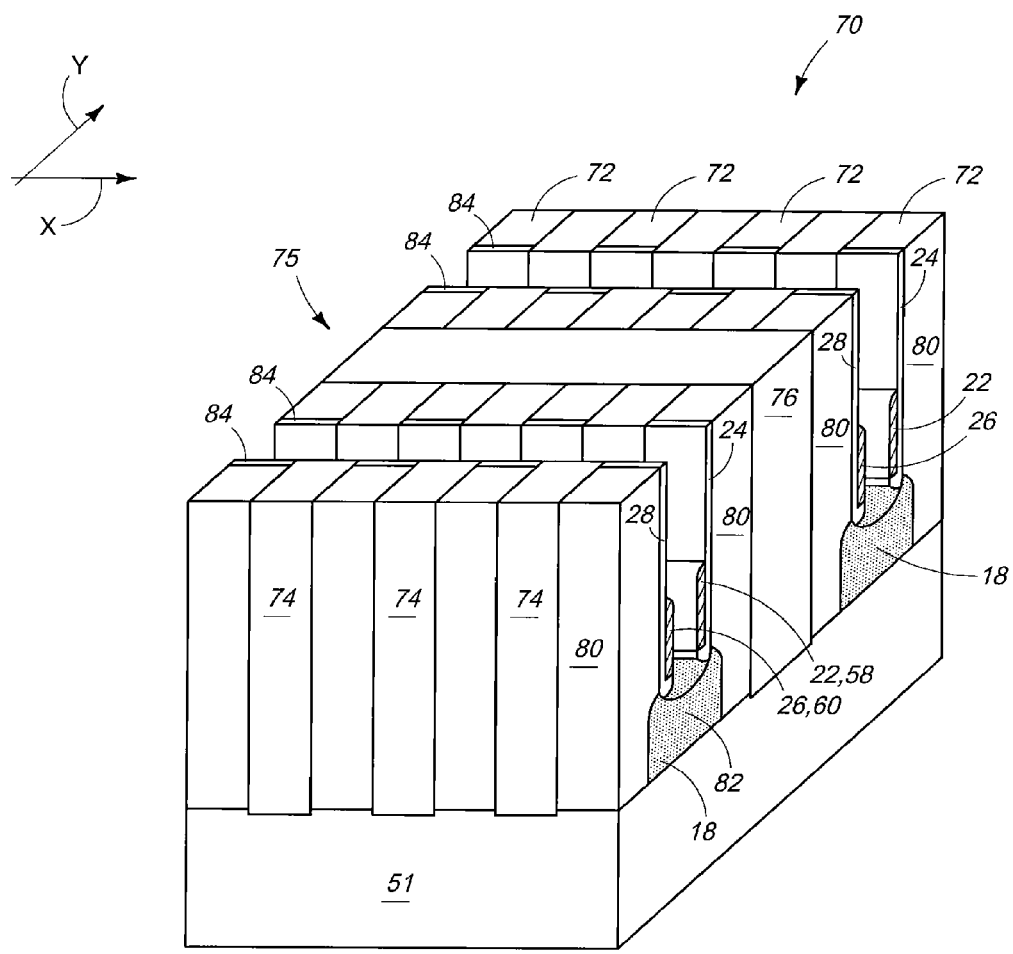
FIG. 14 is a view of the FIG. 13 substrate fragment at a processing step subsequent to that shown by FIG. 13.

Referring to FIG. 14, gate dielectric 24, 28 has been deposited over inner facing sidewalls of at least semiconductor material 72. Such may be of the same composition or of different compositions. The gate dielectric may be formed by one or both of depositing a layer over the substrate, or as another example and as shown by thermally oxidizing the exposed surfaces of semiconductor material 72 including for example the uppermost surface of the depicted region 18. Subsequently, a current conductive material may be deposited to line the depicted openings, and subsequently subjected to an anisotropic spacer etch to form control gate lines 26/60 and access gate lines 22/58. Thus, a control gate is provided operatively laterally adjacent an intermediate portion of one stem 80, and an access gate of an access transistor is provided operatively laterally adjacent an intermediate portion of the other stem 80. Gate dielectric 24, 28 may be exposed and etched through between gate lines 26/60 and 22/58. Further as shown, semiconductor material 72 of region 18 there-beneath may be etched elevationally inwardly and/or undercut laterally.

Figure 15:
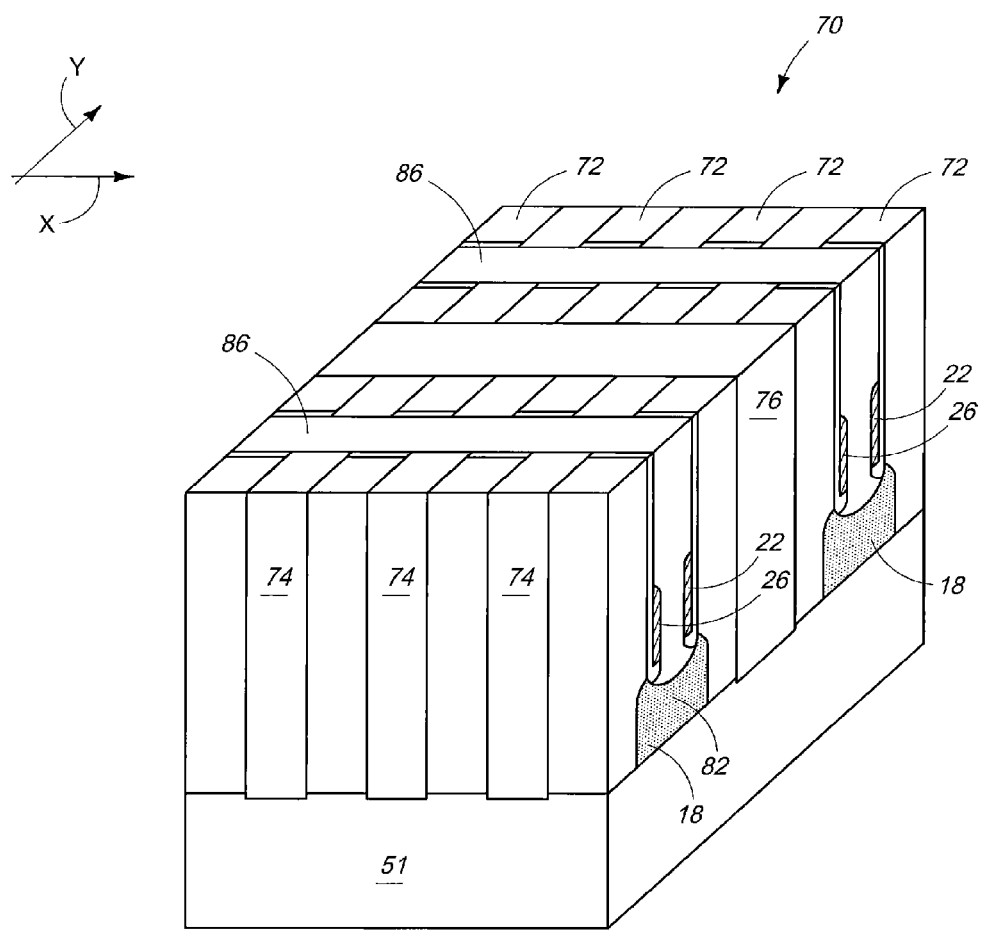
FIG. 15 is a view of the FIG. 14 substrate fragment at a processing step subsequent to that shown by FIG. 14.

Referring to FIG. 15, dielectric 86 has been deposited to fill remaining center volume of the container shapes, and subsequently planarized back.

Figure 16:
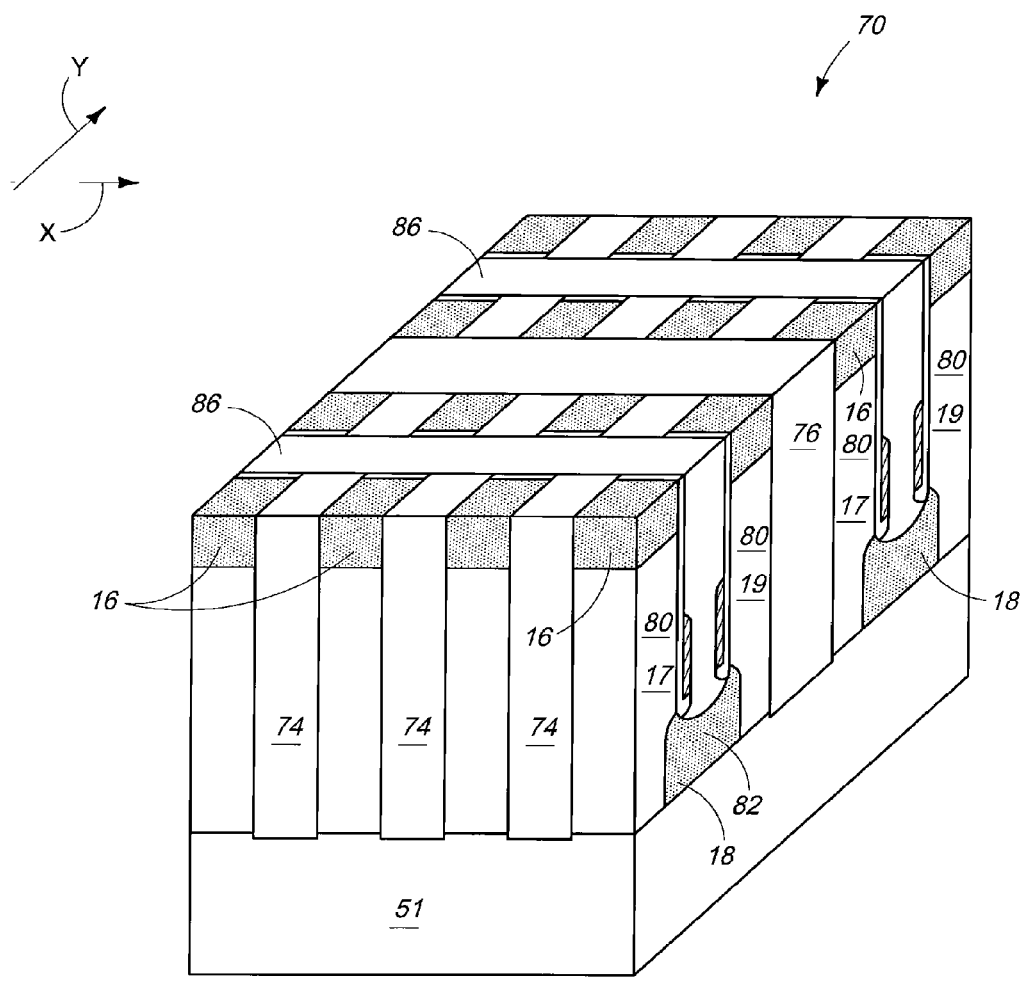
FIG. 16 is a view of the FIG. 15 substrate fragment at a processing step subsequent to that shown by FIG. 15.
Figure 17:
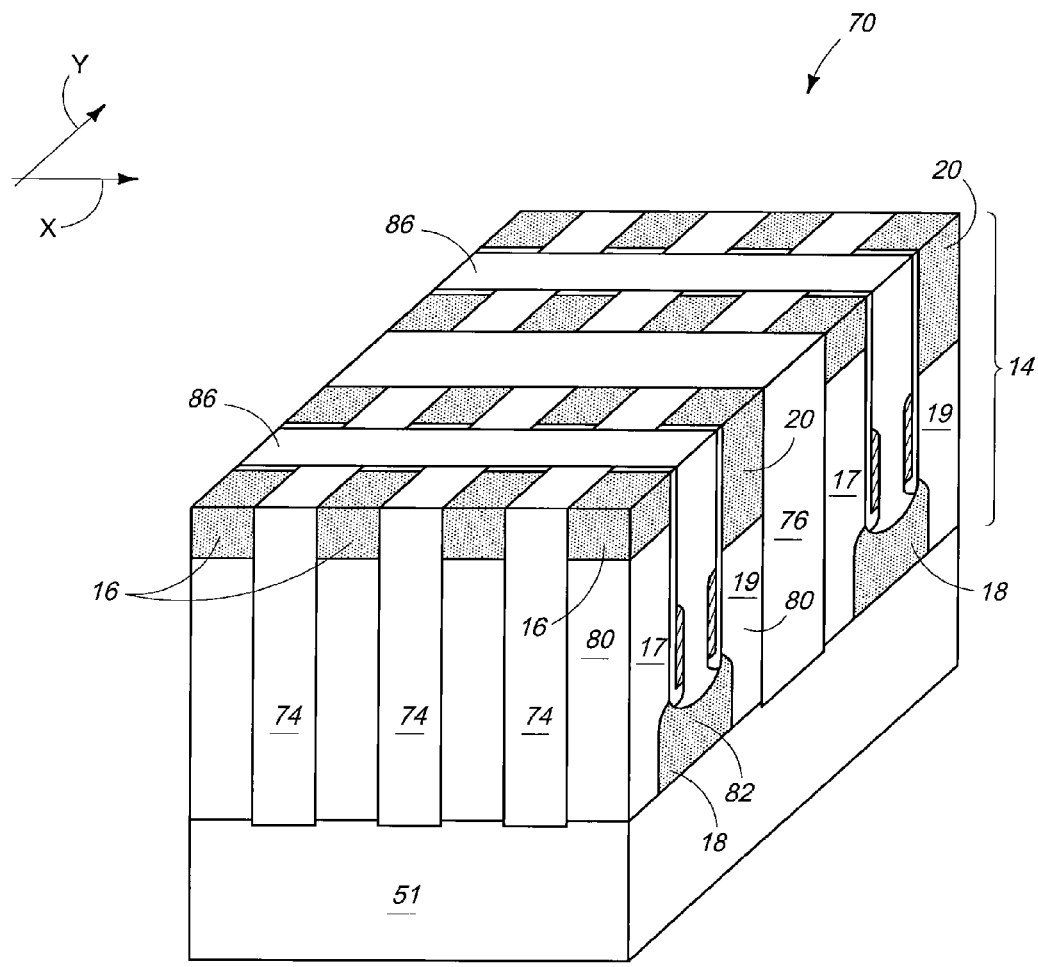
FIG. 17 is a view of the FIG. 16 substrate fragment at a processing step subsequent to that shown by FIG. 16.

Referring to FIG. 16, a suitable conductivity modifying impurity implant of the first type has been conducted into elevationally outermost portions of pair of stems 80, thereby forming example semiconductor regions 16. Referring to FIG. 17, at least such regions 16 have been masked and an implant of the first type conducted into the respective opposing stems to form semiconductor regions 20 of access transistors 14. Accordingly, elevationally outermost portions of one of the pair of stems 80 (namely the left-illustrated of such pairs of stems) is provided at a second impurity concentration of the first type (regions 16) that is lower than the first type impurity concentration within region 18.

Intermediate portions of stems 80 between elevationally outermost portions 16, 20 and base 82/18 are doped with a conductivity modifying impurity of a second type different from the first type and to a third impurity concentration, for example to form semiconductor regions 17 and 19. In one embodiment and as an example, semiconductive material 72 of blocks 78 (FIG. 11) may be provided in FIG. 11 and before to be entirely doped with conductivity modifying impurity of the second type to the third impurity concentration. Regions 16, 18 and 20 may be provided at other impurity concentrations of the second type by the processing described above with respect to FIGS. 15, 16 and 17. Regardless, regions 16 and/or 20 may be doped with their respective conductivity modifying impurity concentrations before or after the implanting to produce regions 18.

Figure 18:
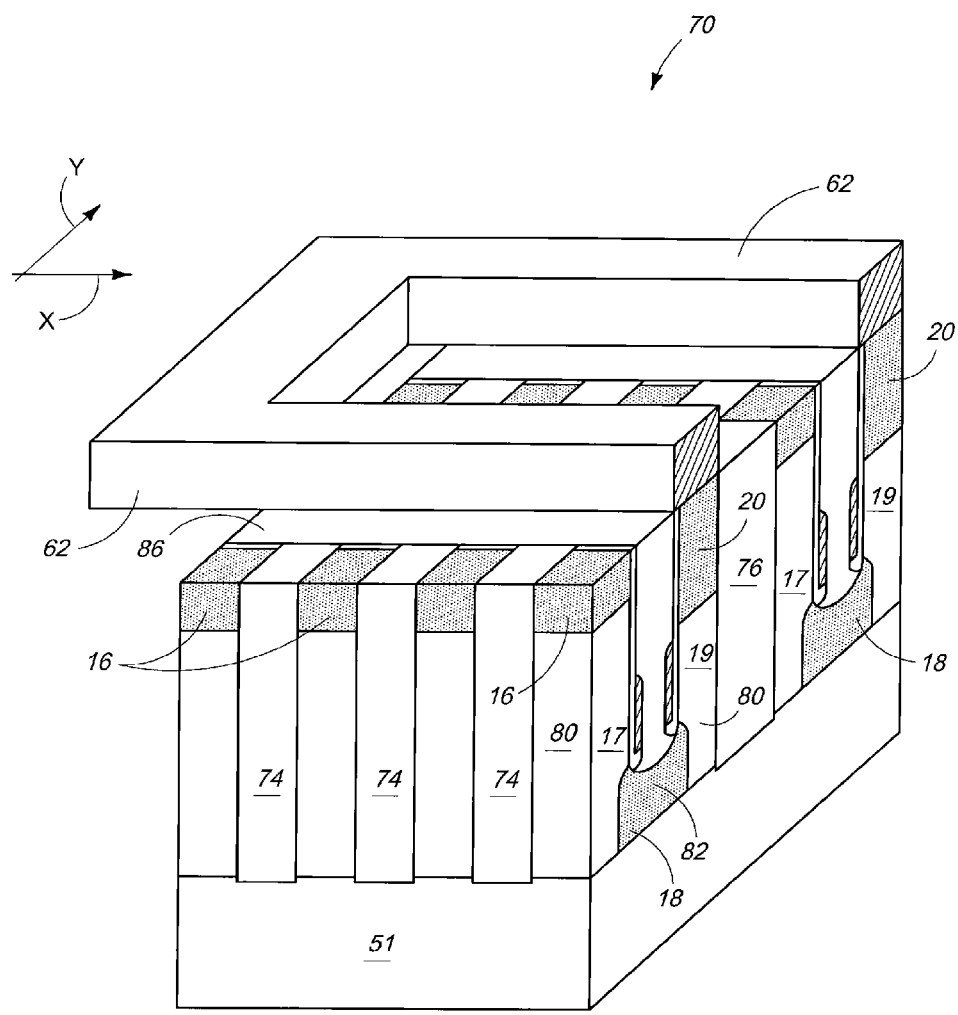
FIG. 18 is a view of the FIG. 17 substrate fragment at a processing step subsequent to that shown by FIG. 17.

Referring to FIG. 18, cathode lines 62 have been formed. Such may be provided by any suitable existing or yet-to-be-developed manner(s), with subtractive patterning and etch and/or damascene-like processing being examples. The respective cathode lines 62 may be hard-wired together as-shown.

Figure 19:
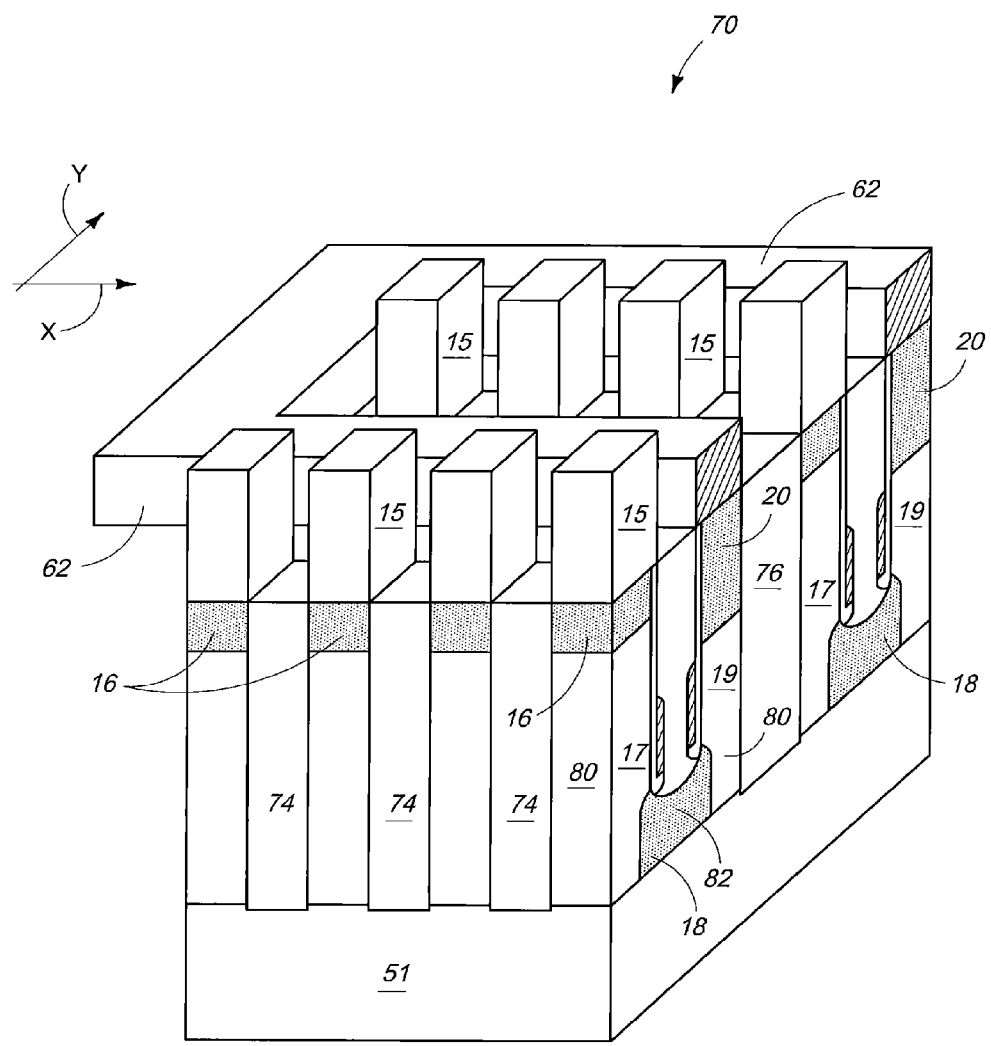
FIG. 19 is a view of the FIG. 18 substrate fragment at a processing step subsequent to that shown by FIG. 18.

Referring to FIG. 19, semiconductor material doped with a conductivity impurity of the second type to a fourth impurity concentration has been formed elevationally outward of and directly against elevationally outermost portion 16 of the left-illustrated stems, thereby forming semiconductor region 15. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. The fourth impurity concentration is greater than the third impurity concentration. Semiconductor regions 15 may also be formed by any suitable existing or yet-to-be-developed manner(s), including for example epitaxial silicon growth. As another example, dielectric material could be deposited and contact openings subsequently etched there-through in the shape of regions 15. Such openings may be subsequently filled or provided with suitable semiconductor material doped with conductivity impurity of the second type to a desired fourth impurity concentration.

Figure 20:
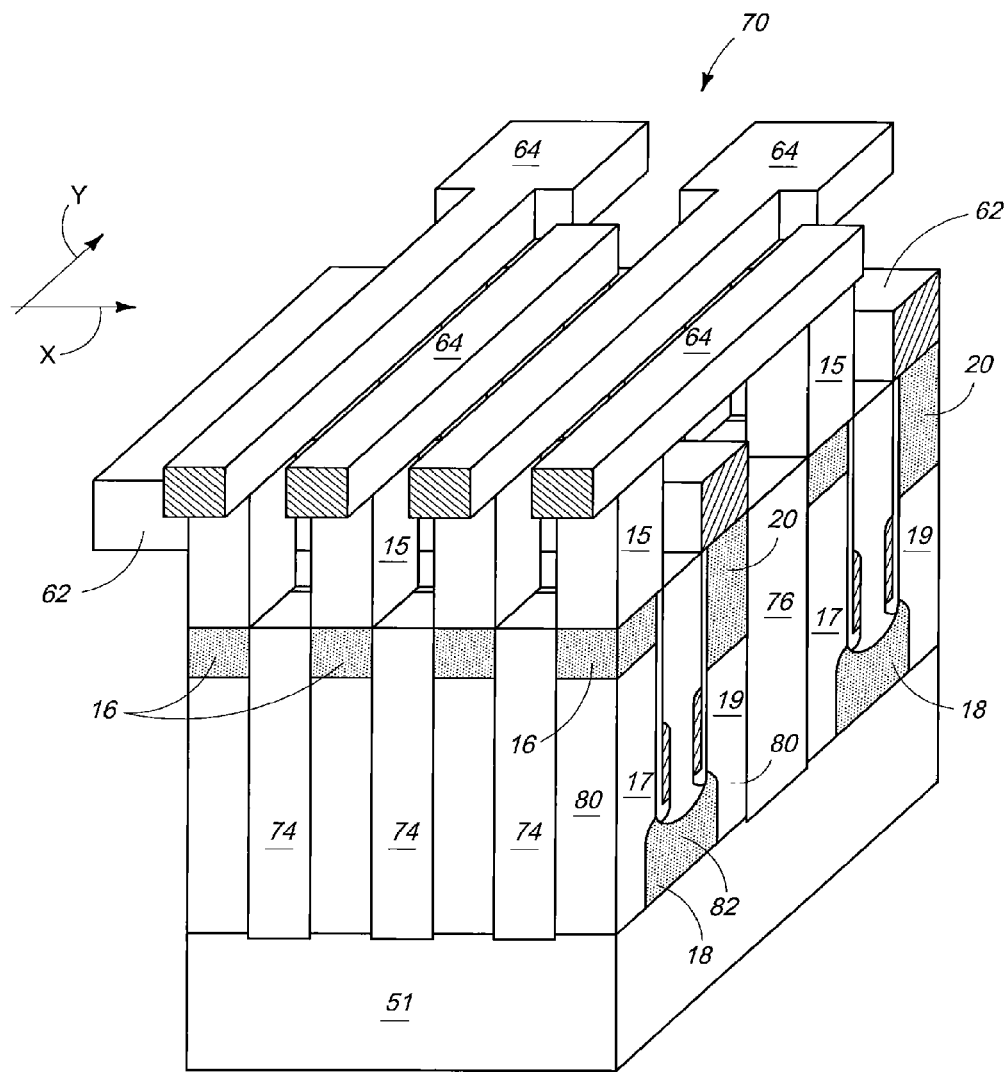
FIG. 20 is a view of the FIG. 19 substrate fragment at a processing step subsequent to that shown by FIG. 19.

Referring to FIG. 20, anode lines 64 may be formed in current conductive connection with semiconductor regions 15. Dielectric material elevationally outward of regions 16, 20 and material there-between is not shown in FIG. 20 for clarity in the drawing.

Figure 21:
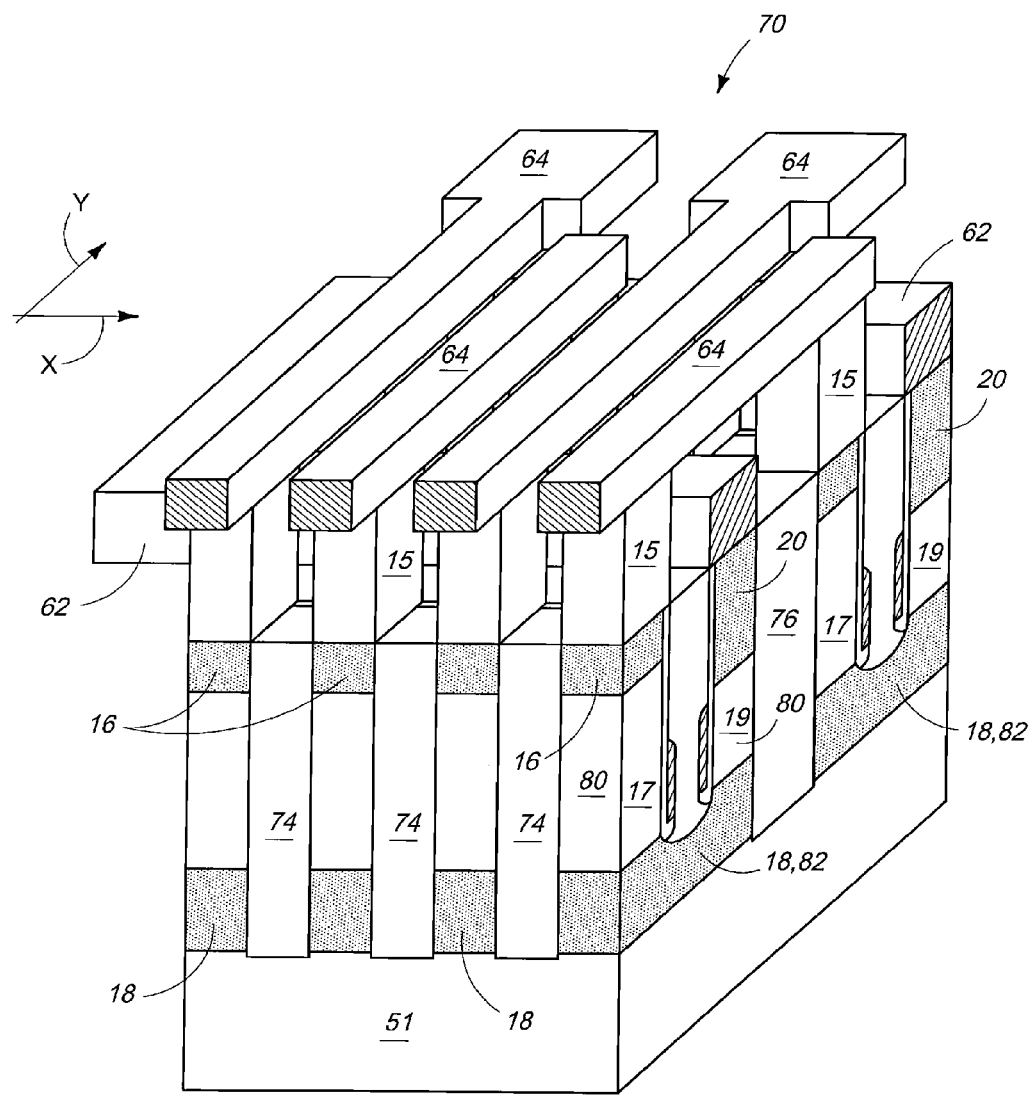
FIG. 21 is a view of the FIG. 20 substrate fragment at a processing step subsequent to that shown by FIG. 20.

Referring to FIG. 21, substrate 70 has been subjected to a suitable anneal to impart lateral diffusion of the dopant within shared region 18 laterally outward. In one embodiment and as shown, such diffusing is to laterally outermost surfaces of stems 80. The processing depicted by FIG. 21 may inherently occur with respect to the above processing associated with FIGS. 14-20 such that a dedicated annealing step may not be conducted. Alternately, no such laterally diffusion may occur such that the finished memory cell construction may have little or no lateral diffusion, for example as depicted in FIG. 14.

Processing may be alternately conducted to produce any of the memory cell or array constructions as described above with respect to FIGS. 3-7, for example to provide any of the control gates and/or access gates as shown and described above.

An embodiment of the invention includes a method of forming a shared doped semiconductor region of a vertically oriented thyristor and a vertically oriented access transistor. Such method comprises forming a general U-shape of semiconductor material in lateral cross section, with such shape having a pair of vertical stems and a base extending laterally there-between in such lateral cross section. The base is doped between the stems with a conductivity modifying impurity of at least one of n-type and p-type, with the shared doped semiconductor region being formed there-from. Such doping may be by ion implanting or other technique.

In one embodiment, the laterally inner facing sidewalls of the stems may be masked from such doping during such doping. In one embodiment, the shared doped semiconductor region may be annealed to diffuse the conductivity modifying impurity laterally outward into the stems, and in one embodiment to a degree to the laterally outermost surfaces of the stems. The above-described processing with respect to FIGS. 13-21 is but one example of such embodiments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a vertically oriented thyristor and a control gate operatively laterally adjacent thereto and of forming a vertically oriented access transistor which shares a doped semiconductor region with the thyristor, the method comprising:
    forming a general U-shape of semiconductor material in lateral cross section, the general U-shape having a pair of vertical stems having a base extending laterally there-between in the lateral cross section;
    forming at least one of an access gate for the access transistor and the control gate for the thyristor within the general U-shape between the stems; and
    after forming the at least one of the access gate and the control gate, doping the base between the stems with a conductivity modifying impurity of at least one of n type and p type and forming the shared doped semiconductor region there-from.

2. The method of claim 1 wherein laterally inner facing sidewalls of the stems are masked from such doping during the doping.

3. The method of claim 1 wherein forming the shared doped semiconductor region there-from comprises annealing to diffuse the conductivity modifying impurity laterally outward into the stems.

4. The method of claim 3 wherein the diffusing is to laterally outermost surfaces of the stems.

5. The method of claim 1 comprising forming the control gate within the U-shape.

6. The method of claim 1 comprising forming the control gate laterally outside of the U-shape.

7. The method of claim 1 comprising forming the control gate both within and laterally outside of the U-shape.

8. The method of claim 1 comprising forming the access gate within the U-shape.

9. The method of claim 1 comprising forming the access gate laterally outside of the U-shape.

10. The method of claim 1 comprising forming the access gate both within and laterally outside of the U-shape.

11. A method of forming a memory cell comprising a vertically oriented thyristor and a control gate operatively laterally adjacent thereto, the memory cell comprising a vertically oriented access transistor which shares a doped semiconductor region with the thyristor, the method comprising:
    forming a block of semiconductor material relative to a substrate;
    etching into the block to form a general U-shape of the semiconductor material in lateral cross section, the general U-shape having a pair of vertical stems having a base extending laterally there-between in the lateral cross section;
    after the etching, ion implanting the base between the stems with a conductivity modifying impurity of a first type to a first impurity concentration;
    providing elevationally outermost portions of the pair of stems to be doped with a conductivity modifying impurity of the first type, providing the elevationally outermost portion of one of the pair of stems to be at a second impurity concentration that is lower than the first impurity concentration;

providing respective intermediate portions of the stems between the elevationally outermost portions and the base to be doped with a conductivity modifying impurity of a second type different from the first type and to a third impurity concentration;

forming semiconductor material doped with a conductivity impurity of the second type to a fourth impurity concentration elevationally outward of and directly against the elevationally outermost portion of the one stem, the fourth impurity concentration being greater than the third impurity concentration;

providing a control gate operatively laterally adjacent the intermediate portion of the one stem;

providing an access gate of an access transistor operatively laterally adjacent the intermediate portion of the other of the pair of stems.

12. The method of claim 11 wherein the elevationally outermost portions of the pair of stems are doped with a conductivity modifying impurity of the first type after the ion implanting.

13. The method of claim 11 wherein the elevationally outermost portion of the one stems is doped with a conductivity modifying impurity of the first type before the ion implanting.

14. The method of claim 11 comprising providing the control gate laterally within the U-shape.

15. The method of claim 11 comprising providing the control gate laterally outside of the U-shape.

16. The method of claim 11 comprising providing the control gate both laterally within and laterally outside of the U-shape.

17. The method of claim 11 comprising providing the access gate laterally within the U-shape.

18. The method of claim 11 comprising providing the access gate laterally outside of the U-shape.

19. The method of claim 11 comprising providing the access gate both laterally within and laterally outside of the U-shape.

20. The method of claim 11 comprising providing the control gate and the access gate only laterally outside of the U-shape.

21. A method of forming a shared doped semiconductor region of a vertically oriented thyristor and a vertically oriented access transistor, the method comprising:

forming a general U-shape of semiconductor material in lateral cross section, the general U-shape having a pair of vertical stems having a base extending laterally therebetween in the lateral cross section; and doping the base between the stems with a conductivity modifying impurity of at least one of n type and p type and forming the shared doped semiconductor region there-from, the forming of the shared doped semiconductor region there-from comprising annealing to diffuse the conductivity modifying impurity laterally outward into the stems, the diffusing not being to laterally outermost surfaces of the stems.

22. The method of claim 21 wherein laterally inner facing sidewalls of the stems are masked from such doping during the doping.

* * * * *